United States Patent
Ewing et al.

(10) Patent No.: US 8,321,163 B2
(45) Date of Patent: Nov. 27, 2012

(54) MONITORING POWER-RELATED PARAMETERS IN A POWER DISTRIBUTION UNIT

(75) Inventors: Carrel W. Ewing, Incline Village, NV (US); James P. Maskaly, Sparks, NV (US); Brian Auclair, Reno, NV (US); Dennis McGlumphy, Sun Valley, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

(21) Appl. No.: 12/717,879

(22) Filed: Mar. 4, 2010

(65) Prior Publication Data

US 2010/0280774 A1    Nov. 4, 2010

Related U.S. Application Data

(60) Provisional application No. 61/157,546, filed on Mar. 4, 2009.

(51) Int. Cl.
*G06F 19/00*     (2011.01)

(52) U.S. Cl. .......................................................... 702/60

(58) Field of Classification Search ................... 702/60; 361/622

See application file for complete search history.

(56) References Cited

U.S. PATENT DOCUMENTS

| | | | |
|---|---|---|---|
| 5,179,376 A * | 1/1993 | Pomatto | 340/870.02 |
| 5,778,237 A * | 7/1998 | Yamamoto et al. | 713/322 |
| 6,714,977 B1 * | 3/2004 | Fowler et al. | 709/224 |
| 7,268,998 B2 * | 9/2007 | Ewing et al. | 361/622 |
| 2007/0291430 A1 * | 12/2007 | Spitaels et al. | 361/79 |

* cited by examiner

*Primary Examiner* — Bryan Bui
(74) *Attorney, Agent, or Firm* — Holland & Hart LLP

(57) ABSTRACT

A power distribution unit (PDU) disposable in an electrical equipment rack. The PDU has a housing, a power input penetrating the housing, outlets in the housing, a processor disposed in the housing, voltage and current sensors, and a voltage calculation procedure communicable with the processor. The processor samples voltage and current waveforms and calculates RMS values and other power parameters. A method of managing electrical loads each drawing electrical power from a PDU includes repeatedly sampling voltage across and current flowing through each of the loads, calculating raw RMS values of voltage and current, and scaling the raw RMS values to obtain corrected RMS voltage and current values and other power parameters.

31 Claims, 19 Drawing Sheets

MONITORING POWER-RELATED PARAMETERS IN A POWER DISTRIBUTION UNIT

RELATION TO OTHER CASES

This patent application claims priority from U.S. Provisional Patent Application 61/157,546, filed 4 Mar. 2009, titled "Systems and Methods for Monitoring Power-Related Parameters in a Power Distribution Unit", the contents of which are incorporated herein by this reference.

BACKGROUND

Power monitoring and metering have long been used in some applications to provide any of a number of items of information to different entities that supply, deliver, and consume power. One common use of such information is to determine energy consumption for purposes of billing a user for the power received by that user. Centralized computing facilities, often referred to as server farms or as data centers, continue to house more and more computing equipment. Such facilities often have numerous individual pieces of computing equipment arranged in racks. Power Distribution Units (PDUs) have long been utilized to supply power to racked electronic equipment in such facilities and in other kinds of facilities as well.

A conventional PDU is an assembly of electrical outlets (also called receptacles) that receive electrical power from a source and distribute the electrical power to one or more separate electronic appliances. Each such unit has a power cord plugged in to one of the outlets. PDUs also have power cords that can be directly hard wired to a power source or may use a traditional plug and receptacle connection. PDUs are used in many applications and settings such as, for example, in or on electronic equipment racks. A PDU located in an equipment rack or other cabinet, together with other devices connected to the PDU such as environmental monitors, temperature and humidity sensors, fuse modules, or communications modules that may external to or contained within the PDU housing may be collectively referred to as a Cabinet Distribution Unit (CDU).

As mentioned, computing facilities generally include electronic equipment racks, such as standard RETMA racks, that commonly comprise rectangular or box-shaped housings sometimes referred to as a cabinet or a rack and associated components for mounting equipment, associated communications cables, and associated power distribution cables. Electronic equipment is commonly mountable in such racks so that the various electronic devices are aligned vertically one on top of the other in the rack. Often, multiple such racks are oriented side-by-side, with each containing numerous electronic components and having substantial quantities of associated component wiring located both within and outside of the area occupied by the racks. Such racks commonly support equipment that is used in a computing network for an enterprise, referred to as an enterprise network.

In many cases, computing facilities such as server farms or data centers support large networks, referred to as enterprise networks. Enterprise networks exist to support large worldwide organizations and depend on a combination of technologies, e.g., data communications, inter-networking equipment such as frame relay controllers, asynchronous transfer mode (ATM) switches, routers, integrated services digital network (ISDN) controllers, and application servers, and network management application software. Such enterprise networks can be used to support a large company's branch offices or campuses throughout the world, and, as such, these networks have become mission critical to the functioning of such organizations. Masses of information are routinely expected to be exchanged, and such information exchanges are necessary to carry on the daily business of modern organizations. For example, some international banks have thousands of branch offices placed throughout Europe, Asia and North America that each critically depend on their ability to communicate banking transactions quickly and efficiently with one another and with their respective headquarters.

A typical enterprise network uses building blocks of router and frame relay network appliances mounted in equipment racks. Such equipment racks are distributed to remote point of presence (POP) locations in the particular network. Each equipment rack can include frame relay controllers, routers, ISDN controllers, servers and modems, etc., each of which are connected to one or more power sources. The value of POP equipment can range from $200,000 to $500,000, or higher, and the number of individual devices can exceed a thousand.

Many equipment racks may be located in a data center. One or more such data centers may serve as data communication hubs for an enterprise. On the other hand, more than one enterprise may use computing facilities in a data center. Existing network management systems provide relatively little information representing the status of a data center or of racks or individual components in the center.

SUMMARY

Briefly and in general terms, aspects of the invention reside in a power distribution unit having a power input, a voltage sensor for the power input, a plurality of power outputs connectable to electrical loads, a current sensor for each output, and a power monitoring section. The power monitoring section receives signals from the sensors and samples the signals to obtain samples of voltage and current during a cycle of input power, calculates raw RMS values of voltage and current, and scales those values according to a predetermined calibration factor to obtain corrected RMS voltage and current values for one or more of the loads.

The power monitoring section may also calculate other power metrics for the loads such as average active power, average apparent power, power factor, input current crest factor, phase angle between voltage and current, and energy consumed over time. The energy consumed may be expressed in kilowatt-hours.

In some embodiments the foregoing components are all installed in a cabinet PDU housing.

In some embodiments the power monitoring section includes an analog-to-digital converter (ADC) that receives signals from the sensors and converts those signals to digital form, processing logic that receives the digital form of the signals, and a memory that may store the converted ADC digital signals as well as any of the power metrics over one or more cycles of input power.

The processing logic may compare samples of voltage and current over different cycles, or samples during a cycle may be compared with pre-stored model samples. In either comparison, if differences exceed a predetermined magnitude, an alert signal can be generated.

In some embodiments a timing sensor detects zero crossings of input voltage cycles. This information is used to calculate input voltage frequency. The zero crossing information may also be used to calculate a reload value that determines input power signal sampling intervals.

Power metrics and alert signals may be transmitted through a communication section to a remotely-located network power manager.

A power distribution unit according to some embodiments includes a power distribution unit housing disposable in an electrical equipment rack of the type in which a plurality of electrical components are removably mountable. A power input penetrates the housing and a plurality of power outputs are disposed in the housing. A processor is also disposed in the housing and is communicable with a voltage calculation procedure which may for example be an RMS calculation procedure. A voltage sensor is communicable with the power input and the processor, and a plurality of current sensors are communicable with one of the power outputs and with the processor.

Aspects of the invention reside in a method of managing a plurality of electrical loads drawing power from a power distribution unit. The method includes sampling voltage across and current flowing through each of the loads repeatedly during one cycle of input power, calculating raw RMS values of voltage and current from the samples, and scaling the raw RMS values according to a predetermined calibration factor to obtain corrected RMS values.

The foregoing is a brief description of various aspects of various exemplary embodiments. The scope of the invention is to be determined by the claims as issued and not by whether given subject matter includes any or all such aspects, features, or advantages or addresses any or all of the issues discussed in the foregoing.

In addition, there are other advantages and varying novel features and aspects of differing embodiments. The foregoing and other features and advantages will become more apparent from the following detailed description, which proceeds with reference to the accompanying figures.

BRIEF DESCRIPTION OF THE DRAWINGS

Several embodiments including the preferred embodiments and currently known best mode of the present invention are shown in the following description and accompanying drawings in which.

DETAILED DESCRIPTION

Figure 1:
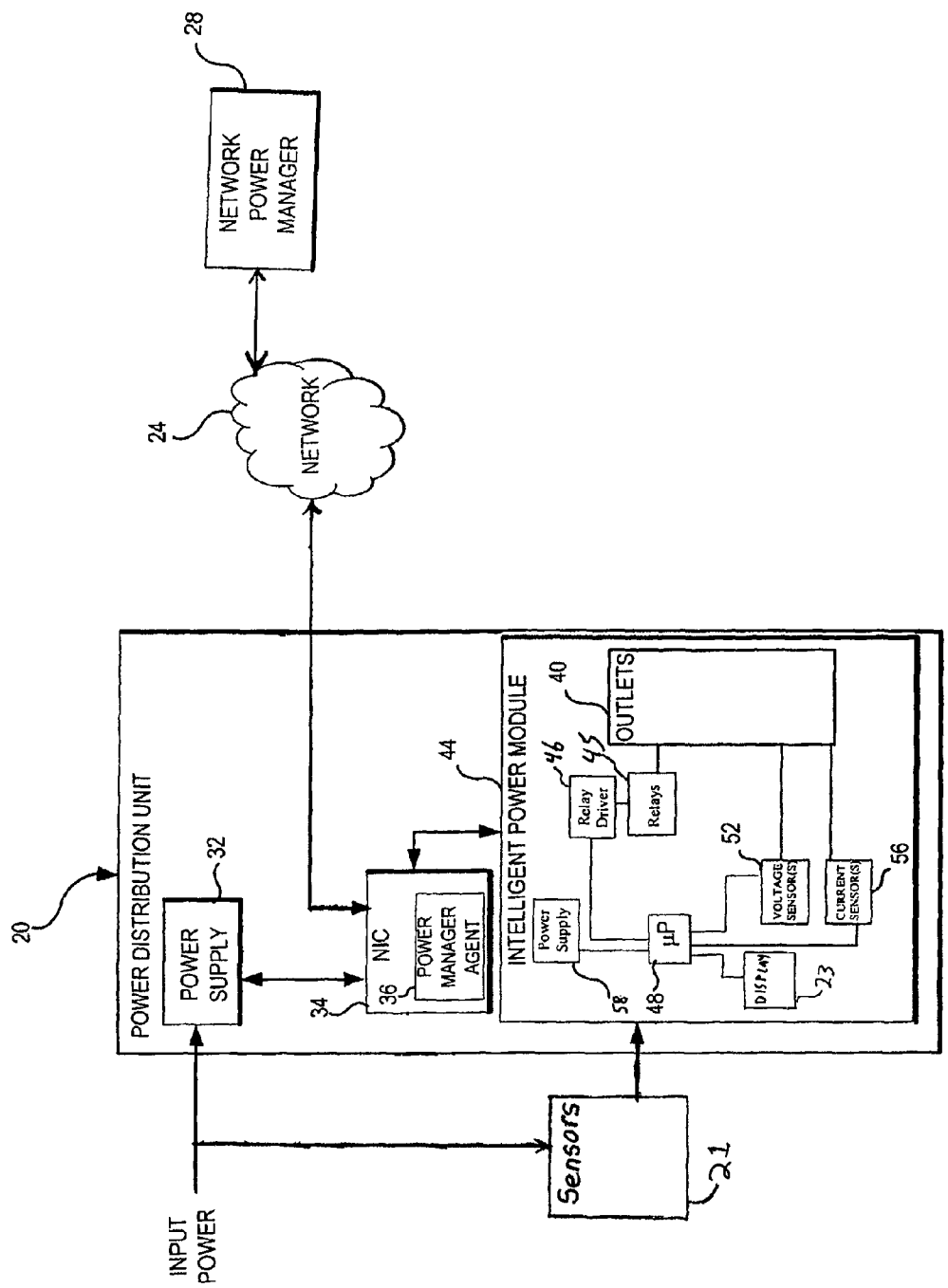
FIG. 1 is a block diagram illustration of a system of an exemplary embodiment of the present disclosure.

Exemplary embodiments of power distribution, monitoring, and management systems are described herein. The present disclosure provides exemplary embodiments with capability to determine the power being delivered to a power distribution apparatus and the power being delivered from the power distribution apparatus to one or more electrical loads. This facilitates efficient determination of power usage for various different components that are associated with a facility, and therefore provides an ability to manage power to the various different components. In many cases, numerous PDUs and CDUs may be located in a facility, with each supplying power to several different electrical loads. Knowledge of power being delivered to various equipment in a facility may be used to evaluate, improve, and manage power consumption in a facility and across multiple facilities, such as data centers.

In various embodiments, systems and methods are provided that sense and output information related to current and voltage provided to various different components and applications powered by one or more PDUs or CDUs. The current and voltage information may be used to provide any of several measurements, referred to as power metrics, such as one or more among the following: power consumed by each component, power factor, crest factor, true RMS current and voltage measurements, active power, apparent power, and energy consumption.

One or more such metrics may be used for a number of purposes, such as for analysis and actions that enhance the efficiency of components that are receiving power, enhance the efficiency of a group of components that are receiving power, enhance the efficiency of a data center, and enhance the efficiency of an enterprise network. Metrics also may be used, for example, to provide information related to management of assets in a computing network, accurate tracking and billing of energy used by assets, and identification of components that are receiving or providing power in an anomalous manner indicating a malfunction or potential malfunction, to name a few examples.

Some embodiments of the present disclosure described in more detail below provide, alone or in combination, one or more advantages over traditional PDUs. In certain embodiments, a PDU has an integrated AC input clock solution, in which a power monitoring circuit or a power meter does not require an external oscillator to provide a time base. Some embodiments may receive the incoming AC waveform to synchronize the internal microprocessor clock to an AC cycle and provide power metrics that are timed to AC cycles to provide accurate measurements. Such a solution can, in certain embodiments, further provide a relatively low cost solution by reducing components, as well as a corresponding reduction in the area required and power used, for performing power monitoring and metering.

Some embodiments include power monitoring and metering circuits that may be used in a number of different applications, such as within a PDU, within a switched-mode power supply, and within commercial and residential power meters, to name a few.

Some embodiments provide predictive failure of various power components. A digitized version of the AC power waveform of a component can be used to identify anomalies in the waveform and thereby flag potential problems with the component. Also, the power being supplied to an individual component can be monitored and used as a basis for identifying abnormal operation of that component.

Some embodiments provide an accurate energy accumulation scheme for one or more outputs associated with a single power monitoring and metering circuit. Voltage or current may be sampled during an AC cycle, and in this regard in some embodiments both voltage and current are sampled nearly simultaneously for an output.

In some embodiments, the product of each of the samples can be summed over the AC cycle. An AC cycle may be sampled at a pre-determined frequency. At each sample interval a single AC cycle is sampled at a much higher sample rate (both voltage and current) to provide the power information which is then accumulated at the lower waveform sampling frequency to provide energy measurement. For example, a predetermined sampling frequency of once every 24 cycles may be used. Such sampled cycles may be scaled and accumulated over a time period to provide an accurate energy measurement (the energy may be expressed in watt-hours) for each output.

In some embodiments, the invention provides a PDU in which one more outputs of the PDU may be switched to provide or remove power to a particular output. In some embodiments, a relay circuit has two transistors, one that initially switches the relay and a separate transistor for holding the relay with lower current draw. The second transistor is switched on a predetermined time following the initial relay turn-on, and subsequently the first transistor is turned off, thus providing a lower current flow through the relay coil. This arrangement uses less power than a switching transistor that holds the relay active. The resulting accumulated savings for numerous PDUs in a facility or network can be significant in certain applications. Such reduced power requirements may also generate less heating related to power consumption and may also enhance the lifetime of such components as compared to implementations not having such reduced power requirements.

Some embodiments having switched output capabilities can provide output switching at or near zero voltage or current crossings of the AC cycle or at least likely below the peak voltage or current in the AC cycle. In some embodiments, for example, the AC waveforms provided to an output are sampled at or near the point of zero current or voltage crossings and outputs may be switched at or near these zero crossings. In embodiments in which relays switch outputs, at or near zero voltage or current crossing can be less stressful on the relay and the relay points. This may result in increased component lifetime and reduced in-rush current into the component that receives power from the respective output to possibly also reduce stress on that component.

Some embodiments of the disclosure provide a modular construction of an outlet assembly with options to provide switched outputs or non-switched outputs, and the ability to determine if lack of power at an outlet is the result of loss of input power or a blown fuse.

Certain embodiments provide a multi-outlet power meter that monitors the voltage and current delivered to one or more power outputs. A monitoring circuit may include a voltage input having an analog-to-digital converter that samples the incoming voltage and provides a digital representation of the incoming voltage waveform. A current input for each power output, connected to the meter, has an analog-to-digital converter that samples the current input and provides a digital representation of the incoming current waveform. The samples of each of the current and voltage waveform may be collected to provide power metrics such as, for example, RMS voltage, RMS current, active power, apparent power, energy, power factor, and crest factor. This information is transmitted from the meter toward network components that may then report the information to a remote user.

In some embodiments, the systems may reveal when one or more components of a power distribution unit, or components that receive power from the power distribution unit, develop an abnormal current or voltage characteristic. Such identification may provide an indication of a potential failure of the component. In some embodiments, current and voltage information are collected for a component and compared against model or historical information. In the event that an anomalous event is detected, a message may be transmitted indicating the same such that an investigation or corrective action may be taken.

In some embodiments, information provided by PDUs or CDUs may be used by an organization to take action such as, for example, corrective action, improving the efficiency of operations, providing power metrics for specific components, providing more accurate billing for energy usage, or identifying equipment that may be a candidate for consolidating operations. In some embodiments, corrective action may be taken such as in the event that a CDU or PDU generates a warning that the current or voltage waveforms of for example, a power supply have a significant deviation from a historical or model waveform. In some embodiments, such deviations may indicate the power supply is malfunctioning and corrective action can be taken. In some embodiments, power metrics may be used to evaluate the operations of different items or groups of equipment to identify areas where efficiency can be enhanced, for example. Similarly, power metrics may be used to determine energy usage, and provide billing for separate pieces of equipment within a rack, for example. Furthermore, power metrics also may be used to identify multiple equipment, such as two servers, that are being used to service an application where utilization of the equipment is such that the operations may be consolidated and one or more pieces of equipment idled or placed in stand-by mode.

Individual equipment may be measured in order to determine various types of information related to power efficiency metrics. In embodiments described herein, power-related information is determined for various types of equipment, and this information provided to determine power usage related to that equipment. In some embodiments, a PDU is provided that senses and outputs the power used by various different components, including monitoring both the input power of the PDU and the power output to various components powered by the PDU. For example, to determine total computing equipment power (Power is (Volts×Amperes) or Watts) delivered by the PDU, the PDU could measure Watts for each input cord to the PDU(s), or the input power at various subcomponents that provide power to one or more pieces of computing equipment. The sum of all the power output to pieces of equipment measures the total computing equipment power delivered by the PDU and consumed by the computing equipment assuming all computing equipment assets are plugged into a PDU having the ability to measure power. In some embodiments, several metrics are calculated for each outlet in a PDU including voltage (true RMS Voltage), current (true RMS Current), active power (Watts), apparent power (VA), energy (Watt-hours), power factor (unitless), and crest factor (unitless). Each of these metrics may be used alone, or in combination with other of the metrics, to provide information related to components that are receiving power from the outputs of the PDU.

In other embodiments, an individual piece of computing equipment efficiency may be determined using one or more of computed metrics, such as MIPS/Watt. MIPS (million instructions per second) is a measure of the speed of execution of a processor. Thus, performance efficiency for a particular server, for example, may be measured or a cumulative efficiency calculated for all equipment in a data center. In embodiments that provide such metrics, the metrics may be provided for each outlet in the PDU, or for a subset of outlets in the PDU. The MIPS value of a component may be read over a network, for example, from the BIOS of the component, and combined with power metrics to provide a measure of performance efficiency. The sum of all the 'per outlet Watts' on a PDU may be used to measure the PDU's efficiency when compared to the input cord power to the PDU. In some embodiments, an individual piece of equipment may receive operating power from multiple power supplies. In such embodiments, the outlets that provide power to the piece of equipment are grouped using an application external to the monitoring circuit, with metrics from each outlet in the group summed to provide the corresponding metrics for the specific asset that is acquiring it power from multiple PDUs, CDUs, or multiple power supplies. Other embodiments provide the ability for an expense charge for the power consumed by each specific asset, and each outlet may record the amount of power used (Watt-hours) in the same manner as a utility meter.

With reference now to FIG. 1, a block diagram of an exemplary system of an embodiment is now described. A power distribution unit (PDU) 20 supplies power to one or more associated computing assets. As previously noted, the PDU 20, together with other devices connected to it, for example environmental monitors, temperature and humidity sensors, fuse modules, or communications modules that may external to or contained within the PDU housing, may be collectively referred to as a Cabinet Distribution Unit (CDU). The PDU is useable in a computer network 24, and may communicate over the computer network 24 with a network power manager application 28. In cases where the PDU 20 is included in a CDU, communication with network power manager 28 is conducted through a communications module within the CDU. The network power manager 28 may reside in a workstation or other device that is used in the management of a data center or other enterprise management, and issues network commands over a network communications connection.

The PDU 20 of this embodiment includes a power supply 32. It also includes a network interface card (NIC) 34 that has application firmware and hardware that allows the PDU 20 to communicate with other modules within a CDU, and in this embodiment includes a power manager agent application 36. The PDU 20 includes a plurality of power outlets 40 arranged within an intelligent power module (IPM) 44. The NIC 34, and power manager agent 36 are connected to the computer network 24. The intelligent power module 44 controls the application of power from the input power to a corresponding power outlet among the power outlets 40, and is in communication with the power manager agent application 36 to provide power and power cycling on-off for one or more of the corresponding power outlets, which may be accomplished through one or more relays 45 and associated relay driver 46. The IPM 44 receives input power, and provides power to one or more outlets 40 through the relays 45. The IPM 44 may also provide power state sensing or load sensing with respect to the corresponding power outlet in response to one or more commands. The IPM 44 in this embodiment includes a microprocessor 48 used to control the power applied to a corresponding power outlet. The microprocessor also is connected to a voltage sensing device 52 and a current sensing device 56 to sense the voltage and current at corresponding individual power outlet(s). The microprocessor 48 uses this information to determine the power supplied through an outlet, as will be described in more detail below. The microprocessor 48 also receives a power measurement from the input power supply 32 through an input voltage sensing device and an input current sensing device 21 internal to the PDU. In this embodiment, the IPM 44 also includes a power supply 58 used to provide DC operating power to components within the IPM 44. A display 23, for example a single- or multi-digit LED display, may be included to provide a visual indication of voltage, current or another power metric; the display is shown as communicating with the microprocessor 48 but could instead communicate directly with other elements such as the sensors 56 or 52. The display may instead by driven by either the NIC 36 or the power supply 32.

The network power manager 28 of FIG. 1 communicates with the intelligent power module 44 through the power manager agent 36. In this embodiment, the network power manager 28 may receive information from, and provide instructions to power manager agent 36 which communicates with IPM 44. The network power manager 28 may also receive related power measurements from the IPM 44 (through power manager agent 36) and report power information related to the PDU 20, and related to one or more individual outlets (and thus power information for individual assets powered by the outlet) of the PDU 20.

Figure 2:
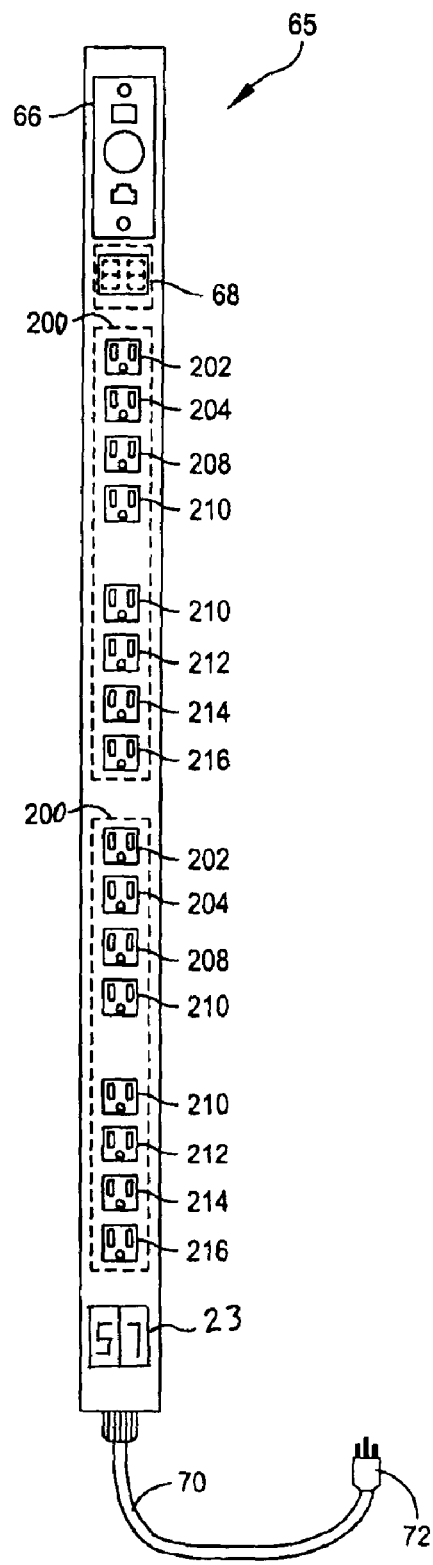
FIG. 2 is an illustration of an exemplary CDU embodiment.

FIG. 2 is an illustration of a CDU 65 that includes Intelligent Power Modules 200, along with a communications module 66 that provides communications functions, an environmental monitor 68, and an input power cord 70 with associated plug 72. The Intelligent Power Modules 200 each include eight outlets 202-216 that supply power to assets that may be mounted into an equipment rack. Such equipment racks are well known, and often include several individual assets that are used in operation of a data center. The CDU 65, as illustrated in FIG. 2, is configured to be vertically mounted in an equipment rack, commonly at the rear of the rack adjacent to the rear side of electronic equipment mounted in the rack. As is well known, numerous equipment racks may be included in a data center, and in various embodiments each asset in each equipment rack may be monitored for power usage through one or more associated Intelligent Power Modules 200. The visual display 23 (shown displaying the numeral "57") is disposed in the CDU 65 although in other embodiments the display might be external to the CDU 65.

Figure 3:
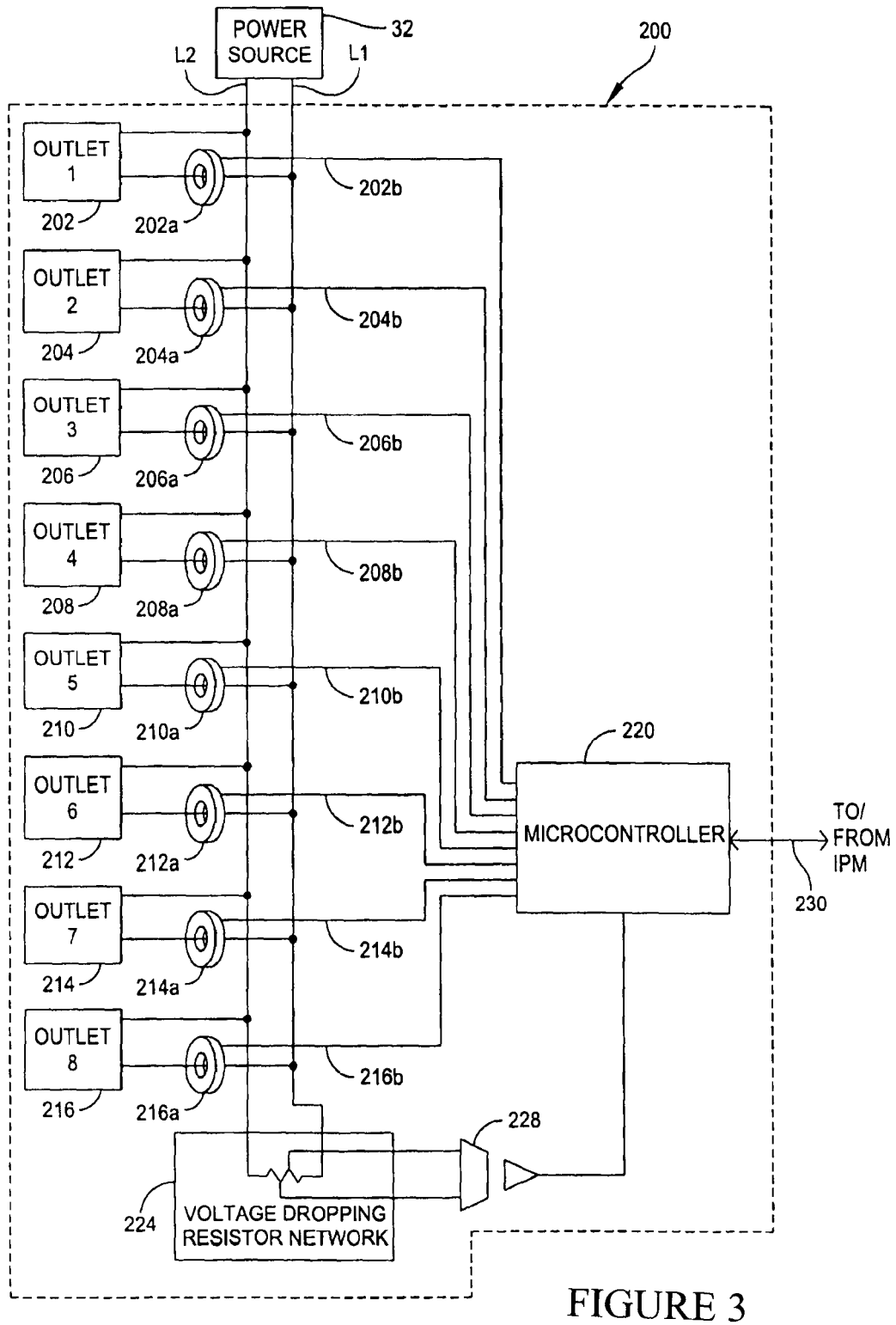
FIG. 3 is a block diagram illustration of a system that senses current and voltage on a per-outlet basis.

FIG. 3 is a block diagram of output power reporting components in an exemplary embodiment. In this embodiment, the PDU includes an Intelligent Power Module 200, also referred to as a power outlet module 200, that includes eight power outlets, 202-216. Each outlet 202-216 is connected to power lines L1 and L2 and then to power source 32. In this embodiment, the power line L1 is connected to line power in the power source 32, and the power line L2 is connected to neutral in the power source 32. However, in other embodiments the lines L1 and L2 may be interconnected to different phases of a polyphase power source. Each outlet 202-216 is also interconnected to a ground in the power source 32, although this connection from the outlets 202-216 is not illustrated in FIG. 3. In this embodiment, each outlet 202-216 has an associated toroidal current sense transformer 202a-216a that senses current flowing through the line L1 for each respective outlet 202-216. The line L1 interconnected to each outlet 202-216 is wired through the respective toroid 202a-216a. The toroidal transformers 202a-216a each has a current reporting cable 202b-216b that provides instantaneous current information related to the respective toroidal transformer 202a-216a to microcontroller 220. Current information may be determined using other configurations, such as through the use of a shunt resistor, hall effect device, or other suitable current sensing device, as will be readily recognized by one of skill in the art. Such other configurations for determining the current provided to an outlet may be used in other embodiments The microcontroller 220 receives this current information related to each respective outlet 202-216.

The power outlet module 200 also includes one or more line voltage sensors, each including a voltage dropping resistor network 224, and an opto-isolated operational amplifier 228 to provide instantaneous line voltage information to the power source 32. The line voltage may also be determined through various other configurations. The line voltage sensor, for example, may include a voltage sense transformer that provides isolation and allows voltage to be determined based on the voltage across the transformer and the turns ratio of the transformer. Other embodiments may not provide isolation, instead achieving isolation from high-voltages in other manners. The microcontroller uses the current information related to each of the respective outlets 202-216, along with the line voltage to calculate the power metrics associated with each of the individual outlets 202-216. This information may be communicated to other components through communications link 230 through, for example, a communications bus. One or more voltage sensors may be provided for each power input if the PDU has more than one, which would be the case for example if polyphase power is provided. Or a separate voltage sensor may be provided for each group of outlets or even for each outlet individually. Using multiple sensors may provide improved accuracy by avoiding the effect of any internal voltage drops in the wiring between the power input to the PDU and the outlets.

In one embodiment, the power outlet module 200 includes eight outlets (202-216) each of NEMA 5-20R type, contained in a housing. It will be understood that this embodiment, and other embodiments described herein as having NEMA 5-20R type outlets, are exemplary only and that any of various other types of outlets alternatively can be used. For example, the "outlets" can be other NEMA types (e.g., NEMA 5-15R, NEMA 6-20R, NEMA 6-30R or NEMA 6-50R) or any of various IEC types (e.g., IEC C13 or IEC C19). It also will be understood that all "outlets" in a particular power outlet module 200, or other module-outlet described herein, need not be identical. It also will be understood that the "outlets" are not limited to three-prong receptacles; alternatively, one or more of the "outlets" can be configured for two or more than three prongs in the mating male connector. It also will be understood that the "outlets" are not limited to having female prong receptacles. In any "outlet," one or more of the "prong receptacles" can be male instead of female connection elements, as conditions or needs indicate. In general, as used herein, female and male "prong receptacles" are termed "power-connection elements". Furthermore, the principles described herein also are applicable to devices that may be hard-wired into an outlet module. While outlet module 200 of this embodiment includes eight outlets, it will be understood that this is but one example and that an outlet module may include a different number of outlets.

The housing for an outlet module may be any suitable housing for such a device, as is known to one of skill in the art, and may be assembled with other modules in a CDU. Such a housing generally includes a front portion and a rear portion, the front portion is substantially planar, and the rear portion is substantially planar and parallel to the front portion. The housing also includes longitudinally extending side portions and transverse end portions. The front portion, rear portion, side portions, and end portions are generally orthogonal to each other in a generally rectangular or box-type configuration. The housing can be made of any suitable, typically rigid, material, including, for example, a rigid polymeric ("plastic") material. In at least certain embodiments, the front and rear portions are made from an electrically insulative material, whereas in other embodiments conducting materials are used for safe ground bonding. The side portions and the end portions may be integrally formed, optionally along with the front portion or the rear portion. Furthermore, while the outlet module described in this embodiment includes a housing, other embodiments may include an outlet module that does not include a housing. For example, an outlet module may include a number of outlets coupled together with no exterior housing that may then be installed into another piece of equipment.

Each outlet 202-216 is interconnected to the power source 32 through any of a number of well known connection schemes, such as spade, lug, plug connectors, screw connectors, or other suitable type of connector. Furthermore, if desired, one or more of these electrical connectors can be located inside the housing or outside the housing, in embodiments where the power outlet module includes a housing.

The microcontroller 220, in this embodiment, receives current information for each outlet 202-216, along with voltage information and calculates various power-related metrics for each outlet, with this information reported through the communications link 230. For example, the power per outlet is determined by multiplying the instantaneous voltage by the instantaneous current for a particular outlet, and integrating this product over time to give energy used (kilowatt hours; etc.) Examples of several metrics will be discussed in more detail below.

With reference now to FIGS. 4-8, schematic diagrams of an exemplary embodiment are now discussed. In this embodiment, various different components of an outlet module may be assembled onto separate circuit boards that are then assembled into an Intelligent Power Module. In such a manner, component boards may be assembled to include features that are ordered by a particular customer or user of a PDU in which the outlet module will be used. Furthermore, a user or customer may desire some, but not all, of the outlets in a PDU to have the capability of reporting power usage related to individual outlets, and thus different outlet modules, or subsets of outlets in a outlet module, may be assembled with the additional component boards to provide such capability. Similarly, in the embodiment of FIGS. 4-8, each outlet in the outlet module may be individually switched on or off through a remote power manager. However, other embodiments do not provide such switching capability, and the components described with respect to switching outlets would therefore not be included in such embodiments, replaced instead with simple pass-through components.

Figure 4:
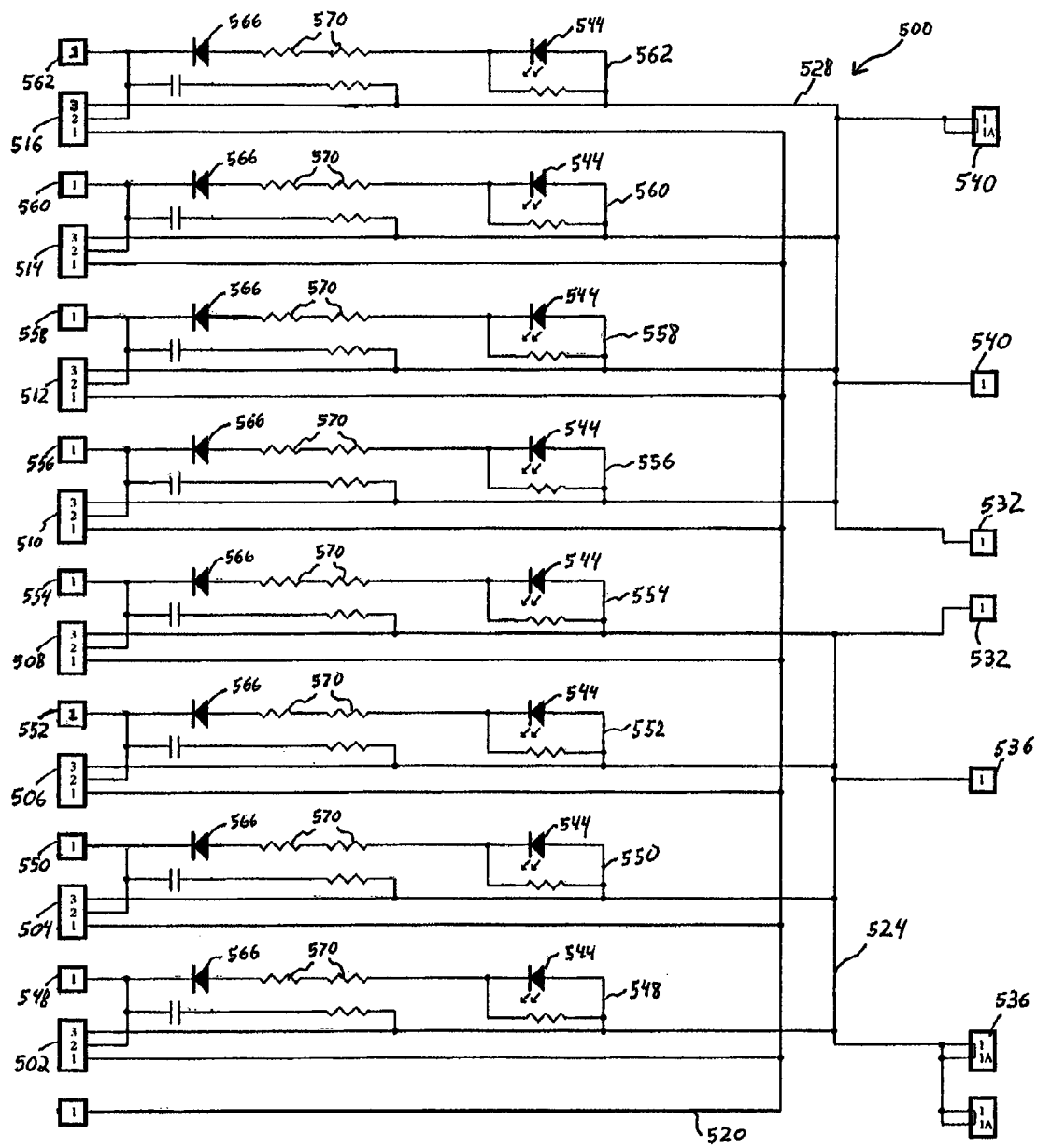
FIG. 4 is a schematic illustration of a bus circuit with voltage indicators of an exemplary embodiment.

In this embodiment, an outlet module includes eight (8) individual outlets organized into logical groups of four outlets each. FIG. 4 provides a partial schematic illustration of an outlet circuit 500 for such an embodiment. In this embodiment, eight outlets 502-516 are assembled to be included in an outlet module (in FIG. 4 only the connection points, not the actual outlets, are shown). In this embodiment, outlet 502 and 516 are IEC-C19 type connectors, and outlets 504-514 are each IEC-C13 type connectors, although it will be readily recognized that outlets may be any suitable outlet type as required for a particular application. The outlet circuit 500 includes a ground input 520 that is electrically connected to a ground connection in each respective outlet 502-516. A neutral line may be electrically connected to each outlet 502-508 through a neutral input 524 that is provided for the four outlets 502-508, with a neutral line electrically connected to each outlet 510-516 through a second neutral input 528. Alternatively, if all eight outlets 502-516 are to be connected to a single power source, the neutral line for each set of four outlets may be connected through a hard-wire jumper connecting the two connection points 532; this allows a neutral connection to either the connection point 536 or the connection point 540 to electrically connect the neutral for each outlet 502-516. As will be readily understood, a line voltage may be provided in place of a neutral connection in applications requiring higher voltages for the outlets 502-516.

With continuing reference to FIG. 4, this embodiment provides a visual indicator at each outlet 502-516 that voltage is present at the outlet 502-516. The visual indicator is provided through a LED 544 that is interconnected between line power and neutral for each outlet 502-516. Line power for each outlet 502-516, in this embodiment, is provided through line inputs 548-562. Each line input 548-562 may be connected through a switch to line power from a power source, as will be described in more detail below. In such a manner, when a respective switch is configured to supply power to an outlet 502-516, the LED 544 associated with the outlet 502-516 will illuminate, thus providing a true visual indication that voltage is being provided to a particular outlet 502-516. The LED 544, in this embodiment, is electrically connected between the line input and neutral through current limiting resistors 570 and diode 566. In other embodiments, such a visual indicator may not be desired, and in such embodiments the components related to the visual indicator may be omitted. As mentioned, line power is provided through separate line inputs 548-562 for each respective outlet 502-516. In some embodiments, the line inputs 548-562 are electrically connected to switches to provide switched electrical outputs 502-516, and in other embodiments some or all of the line inputs 548-562 may be connected in an unswitched configuration to a line power input to provide unswitched outputs.

Figure 5:
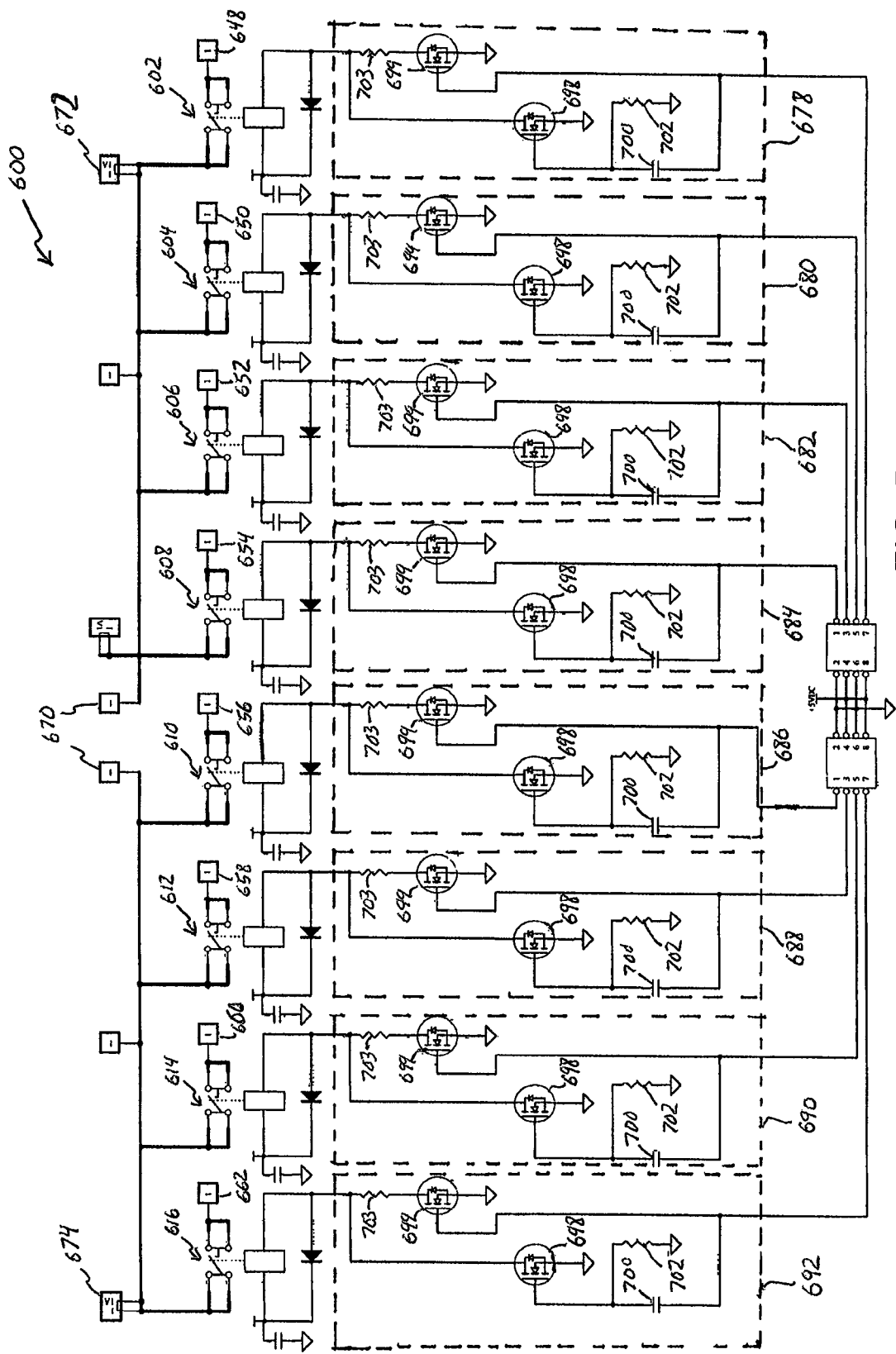
FIG. 5 is a schematic illustration of a relay circuit of an exemplary embodiment.

As mentioned, in some embodiments switched outputs are provided. With reference now to FIG. 5, provided in this embodiment is a relay circuit 600. The relay circuit 600 may be provided on a separate printed circuit board that is configured to couple with the outlet circuit 500. In such a manner, if switched outlets are required for an outlet module, the relay circuit may be assembled with the outlet module to provide such functionality. When switched outputs are not provided, this circuit board may be replaced with a simple pass-through circuit board having the same connections to other circuit boards, simplifying assembly and manufacturing of such power outlet modules. The relay circuit 600 includes relays 602-616 that provide line power to each outlet 502-516, respectively. The output of each relay 602-616 is provided to line power outputs 648-662 that, when coupled to outlet circuit 500, are connected to line inputs 548-562, respectively.

When all eight outlets 502-516 are to receive power from one line power input, line power jumper 670 is installed and line power is provided to the relay circuit 600 through either power inputs 672 and 674. When a line power input is provided for each set of four outlets 502-518, and 510-516, line power jumper 670 is removed and line power is provided through power inputs 672 and 674.

Each relay 602-616 is connected to a relay driver circuit 678-692, respectively, that provide signals to switch the relays 602-616. The relay driver circuits 678-692 are electrically connected through a connection 696 to a microcontroller 904 (see FIG. 8) via a decoding latch 908. In this embodiment, relay driver circuits 678-692 each include a switching transistor 698 and a holding transistor 699. When the relay control circuit provides voltage to switch a particular relay driver circuit 678-692, the voltage is applied directly to the holding transistor 699 and switching transistor 698 through a capacitor 700 and a resistor 702. In this manner, upon the application of voltage to the relay circuits, both the switching transistor 698 and the holding transistor 699 receive voltage and act to switch the respective relay 602-616 and connect line power to the respective outlet receptacle. After a short time period, the capacitor 700 charges and reduces current flow through resistor 702 such that the voltage at the switching transistor 698 drops and the switching transistor 698 switches off. The holding transistor 699 continues to provide adequate voltage to hold the respective relay 602-616 closed with reduced current through current limiting resistors 703.

In such a manner, the power required to hold the relays 602-616 is reduced as compared to the power required to initially switch the relays 620-616 from open to closed. In one embodiment, the holding transistor requires about 75% of the power to maintain the relays 602-616 closed than would be present if a single transistor were used to both switch and hold. In embodiments where numerous switched outlets are present in a facility, such power savings can be significant in operating power reduction for the associated CDUs, which in turn reduces heating, allows for increased component density on a circuit board or within a housing, and also increases the lifetime of components. Other embodiments, however, may include different switching components as will be readily apparent to one of skill in the art.

Figure 6:
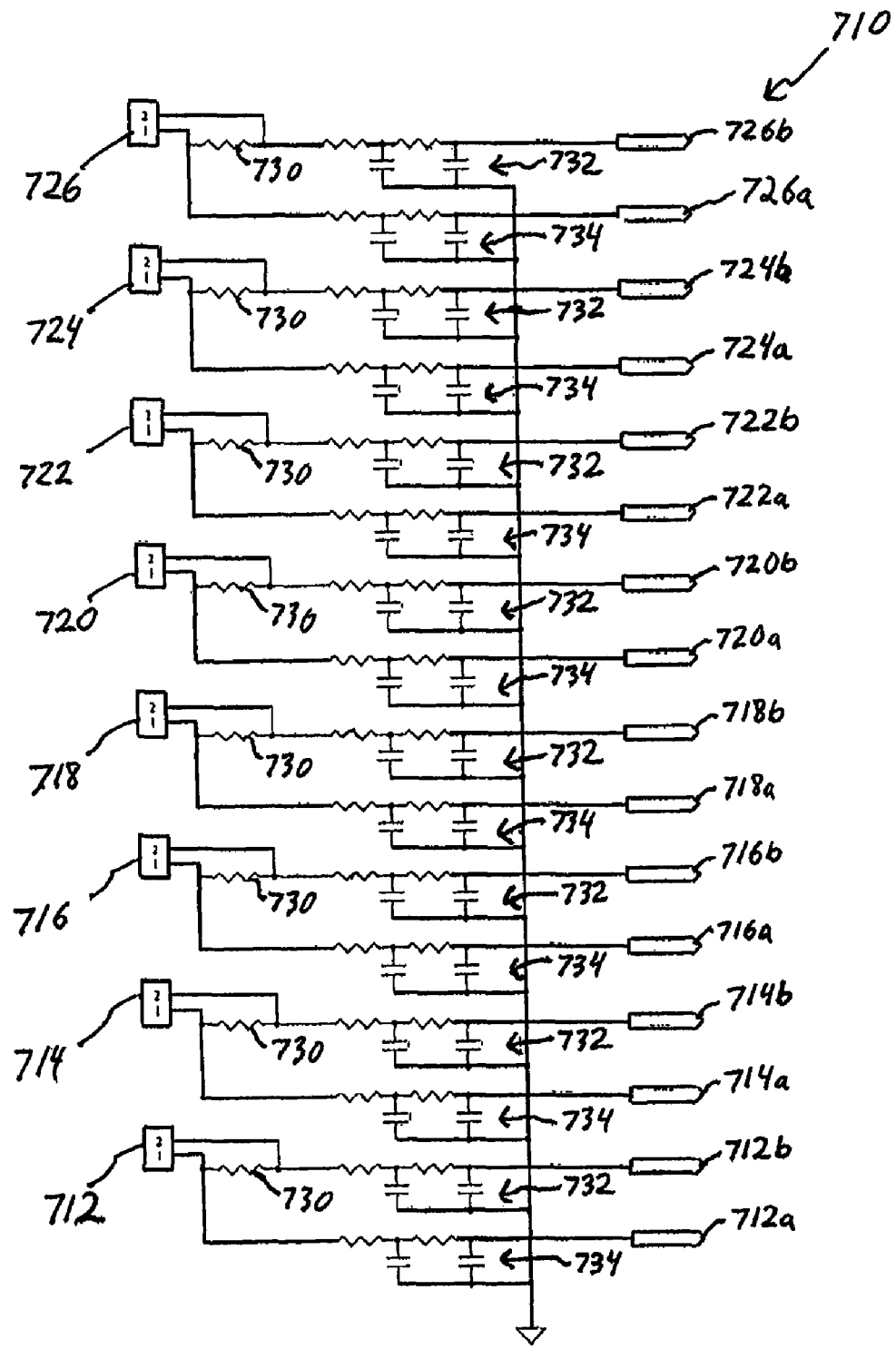
FIG. 6 is a schematic illustration of a current transformer conditioning circuit of an exemplary embodiment.
Figure 7:
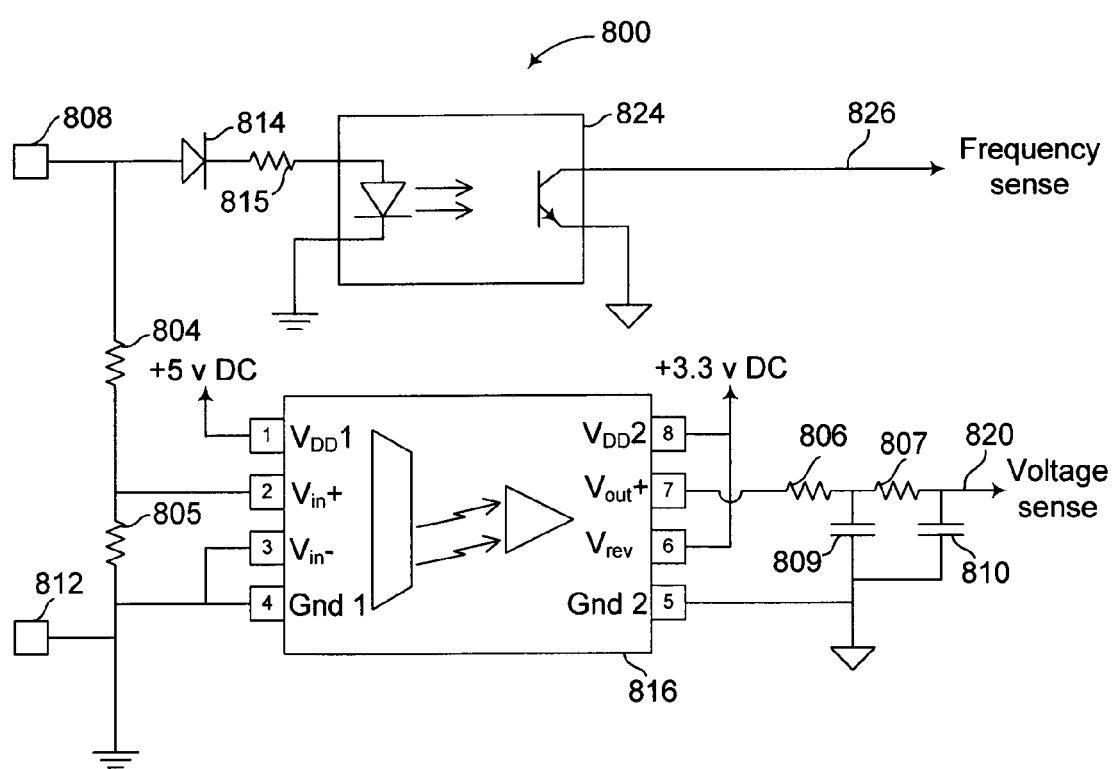
FIG. 7 is a schematic illustration of a voltage sensing circuit of an exemplary embodiment.
Figure 8:
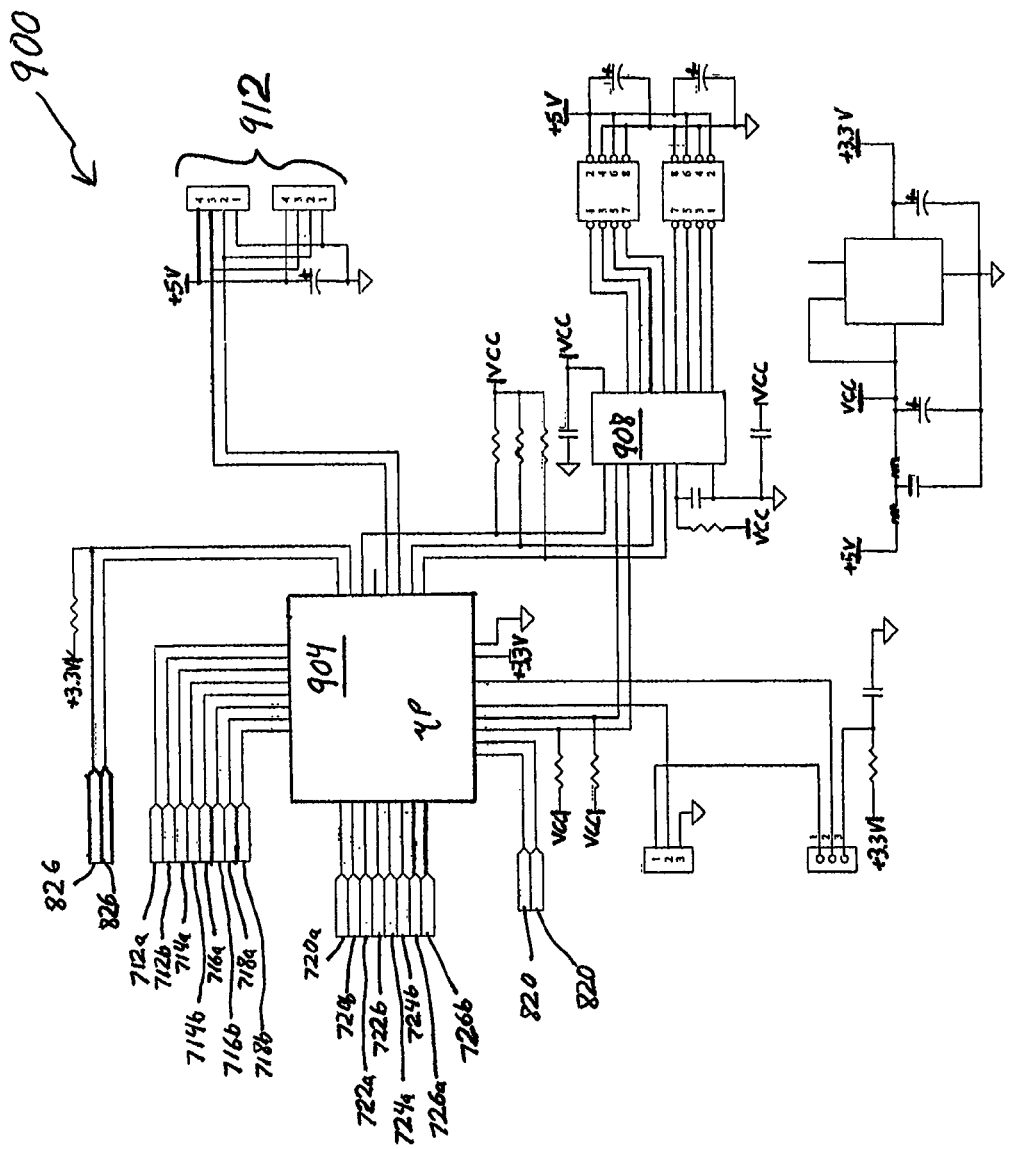
FIG. 8 is a schematic illustration of a microcontroller and digital portion of a relay drive circuit of an exemplary embodiment.
Figure 14:
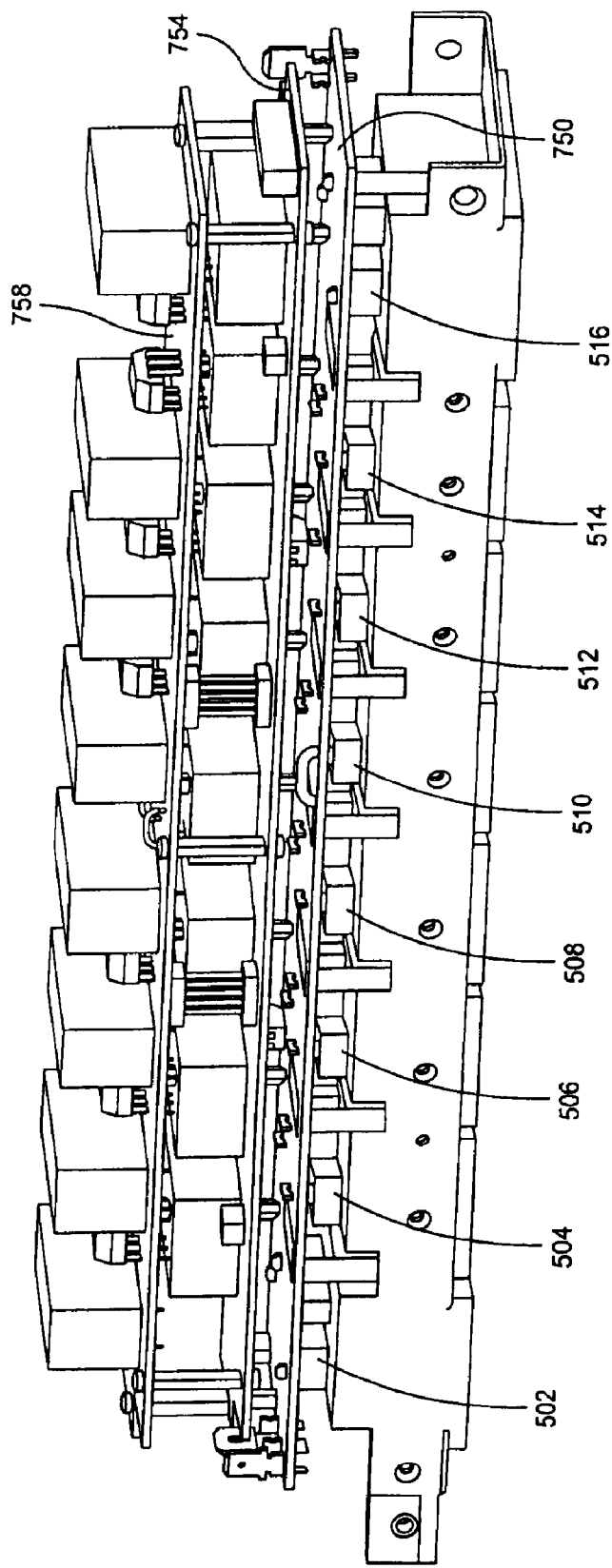
FIG. 14 is an illustration of a three printed circuit board PDU assembly of an embodiment.

With reference now to FIG. 6, current sensing is described for this embodiment. A current sensing circuit 710, in this embodiment, is included as a separate printed circuit board that can be assembled into a power outlet module when it is desired to have the capability to provide current information related to each individual outlet in an outlet module. Such a circuit board may be used in conjunction with other circuit boards, such as the relay circuit 600 of FIG. 5. Such a configuration is illustrated in FIG. 14, in which the circuitry of FIG. 4 is contained on the bottom printed circuit board 750, the circuitry of FIGS. 6-8 is contained on the middle circuit board 754, and the circuitry of FIG. 5 is contained on the upper circuit board 758. The electrical connections of each of the circuit boards may be designed such that the boards may be assembled with related inputs/outputs and connections that are aligned so as to provide for efficient modular assembly of power outlet modules that incorporate some or all of the features described herein through the addition of one or more related printed circuit boards. In some embodiments the circuits shown in FIGS. 5, 6 and 7 are all contained on one printed circuit board.

As illustrated in FIG. 6, current transformers (CTs) connected to connection points 712-726 are provided that sense current flowing in an associated conductor that is routed through the individual current transformers. The CTs in this embodiment are zero-phase toroidal inductors that each have two output lines, the output proportional to the magnitude of the current that is flowing through the conductor associated with the current CTs. In this embodiment, the line power conductor for each outlet 502-516 is routed through a corresponding CT. The respective CT 712-726 outputs a signal that corresponds to the magnitude of the current which, in this embodiment, is output on two output leads across a burden resistor 730. This configuration provides the ability to sense output currents up to 16 amperes with a maximum crest factor of 2.5, although it will be readily apparent to one of skill in the art that other configurations are possible.

In the embodiment of FIG. 6, each CT is connected to a related passive two-pole anti-aliasing filter 732, 734 to provide current sense outputs 712a, 712b through 726a, 726b for each outlet. The current sense outputs 712a, 712b-726a, 726b are provided as differential input to a microcontroller differential analog-to-digital input for use in determining the power metrics related to a particular outlet. Also provided to the power sensor is information related to the line voltage that is present on each outlet so as to provide voltage and current information for use in determining power metrics. In this embodiment, as will be described in more detail below, the power sensor is a microcontroller that includes an analog-to-digital converter with inputs for the current sense outputs 712a, 712b through 726a, 726b, as well as voltage sense inputs for line voltage.

Line voltage measurements are provided, in this embodiment, through a voltage sensor circuit 800 that is illustrated in FIG. 7. The voltage sensor circuit 800 includes a voltage divider consisting of a resistor 804 and a resistor 805 connected in series across the line power between a first end 808 and a neutral input at a second end 812. Positive and negative voltage inputs to an opto-isolated amplifier 816 are connected across the resistor 805. Similarly as described above, other voltage sensing circuits may be used, such as a voltage sense transformer may be used instead of a voltage dropping resistor network, for example. Also, in some embodiments voltage sensing may be provided that is not opto-isolated with any required isolation provided by other well known methods. The output of the opto-isolated amplifier 816 is provided as a voltage sense signal at an output 820 through a passive two-pole anti-aliasing filter consisting of resistors 806 and 807 and capacitors 809 and 810.

An opto-coupler 824 is connected to the line input through a diode 814 and a resistor 815 and provides a frequency sense signal at an output 826 to indicate that AC line voltage is present at the Intelligent Power Module and also provides an approximately 50% duty cycle output that is based on the line frequency of the input power. Thus, for each AC cycle of the input power, the frequency sense signal will have a logical high signal for approximately one half of the AC cycle. The leading or trailing edge provided by the frequency sense signal provides an accurate measurement of the frequency of the input voltage frequency that may be used by a processing circuit to synchronize power metrics to an AC cycle.

In embodiments where all of the outlets of an outlet module are powered by a single power source, a single voltage sensor circuit 800 is used, and in embodiments where different outlets in the outlet module are supplied power from different power sources, a second voltage sensor circuit is provided for the second power input to the outlet module. As discussed above, this embodiment may be implemented using printed circuit boards that provide circuitry for various features described. In this embodiment, the voltage sensor circuit(s) are provided on the same printed circuit board as the current sensor circuit 710, although it will be readily recognized that other configurations may be implemented.

Referring now to FIG. 8, a power sensor and control circuit 900 is described for an embodiment. The power sensor and control circuit 900, in this embodiment, is included on the same printed circuit board as the current and voltage sensor circuits 700, 800, although other implementations will be readily recognized. The power sensor and control circuit 900 includes a microcontroller 904 that receives all of the current sense signals 712a, 712b through 726a, 726b, and receives voltage sense signal(s) 820. These signals are received and processed to determine the power metrics related to each outlet 502-516 in the outlet module. The microcontroller 904 is interconnected to an addressable latch 908 that provides control signals to the relay drivers 678-692 and relays 602-616, if present. The microcontroller 904 also includes communications connections 912 that may be coupled to a communications bus to receive and transmit data from/to the bus. In this embodiment, the microcontroller 904 has 16 current input channels, two per outlet, which are electrically connected to the current sense outputs 712a, 712b through 726a, 726b, and two voltage input channels which are electrically connected to voltage sense output(s) 820. The microcontroller includes ADC inputs that digitize the current and voltage sense signals. Relative to the current sense signals, the ADC includes a differential ADC input based on the two inputs from the current sensor associated with each outlet.

In this embodiment, the microcontroller 904 filters the current and voltage sense signals to reduce high-frequency noise that may be present. The digitized current sense signals are scaled for 16 Amps with a 2.5 crest factor, in this embodiment. The voltage sense signals(s) are received on voltage input channels. In embodiments having different power sources for some outlets, one voltage input channel per outlet group is provided. The voltage input channels are provided to a single-ended ADC input and a digitized output scaled for +/−390 volt peaks. The frequency sense signals for each power source are also provided to the microcontroller. The frequency sense signal(s), in some embodiments, is (are) used for frequency determination and timing of cycle sampling to provide accurate correlation of inputs to a particular AC cycle. The timing, in an embodiment, is auto-adjusted every second to compensate for inaccuracies, such as temperature drift, in the internal clock of microcontroller 904.

Use of the frequency sense signal 826 provides for accurate timing in the microcontroller 904 without the use of an external oscillator as an accurate time base. The ability to measure the frequency sense signal 826 provides enhanced accuracy for timing used in calculating power-related metrics for each outlet. In this exemplary embodiment, two signal types are digitized by an ADC within the microcontroller, the voltage and current signals. Synchronizing the sampling of both the voltage and current waveforms, utilizing frequency sense signal 826, provides for enhanced accuracy in the power-related measurements. It is well known that internal clocks in microcontrollers such as microcontroller 904 have some variability, such as plus or minus two percent. Such internal clocks are typically subject to frequency shift with changing temperature, and also have variability between different microcontrollers. In this embodiment, the frequency sense input allows for real-time compensation of the microcontroller internal clock variance to insure accurate sampling of the AC voltage and current waveforms. The voltage and current sense inputs on the microcontroller 904 are sampled nearly simultaneously 120 times per any AC cycle. The number of samples per cycle, 120 in this example, provides sampling of frequency content up to the 14th harmonic of a 50 or 60 hertz power input, allowing for measurement of real energy at harmonics present in a non-perfect sinusoid. The ADC, in an embodiment, within the microcontroller is a 10-bit ADC hardware, with four times over-sampling to provide an effective 11-bit ADC.

The computation of several power metrics will now be described, for an exemplary embodiment. In this embodiment, discrete samples are taken for one current and voltage channel for an AC cycle, which produces a digital measurement at each sample interval. After the samples are taken over one cycle, calculations are performed by the microcontroller, these calculations consume about one-and-a-half AC cycles in this embodiment. After the calculations are performed, the next channel is sampled beginning at the start of the next AC cycle. Thus, in this embodiment, there are three cycles dedicated to the first channel, the next three cycles dedicated to the second channel, and so on. Accordingly, in this embodiment with eight outputs monitored, each channel is sampled once every 24 AC cycles.

Also, voltage and current inputs are calibrated and provided to the microcontroller 904 in some embodiments. The current inputs, in an embodiment, are scaled to 16 amps at 2.5 crest factor and with the voltage input(s) scaled for 390 volts. Variances in the resistors and toroids, in an embodiment, is accounted for through calibration of the input channels. In one embodiment, the voltage and the current are calibrated based on active power and apparent power for each channel, although calibration based on other metrics may be used, such as calibrating the voltage and current individually. In embodiments that calibrate voltage and current individually, any errors that are in opposite directions will tend to cancel, and any errors in the same direction will be multiplied, when doing a power calculation. In embodiments that calibrate based on active and apparent power, the multiplied error may be reduced. The microcontroller 904, in this embodiment, also provides for calibrations to account for system phase error and provide near-zero to near-full-span voltage and near-zero to near-full-span current digitization.

Figure 9:
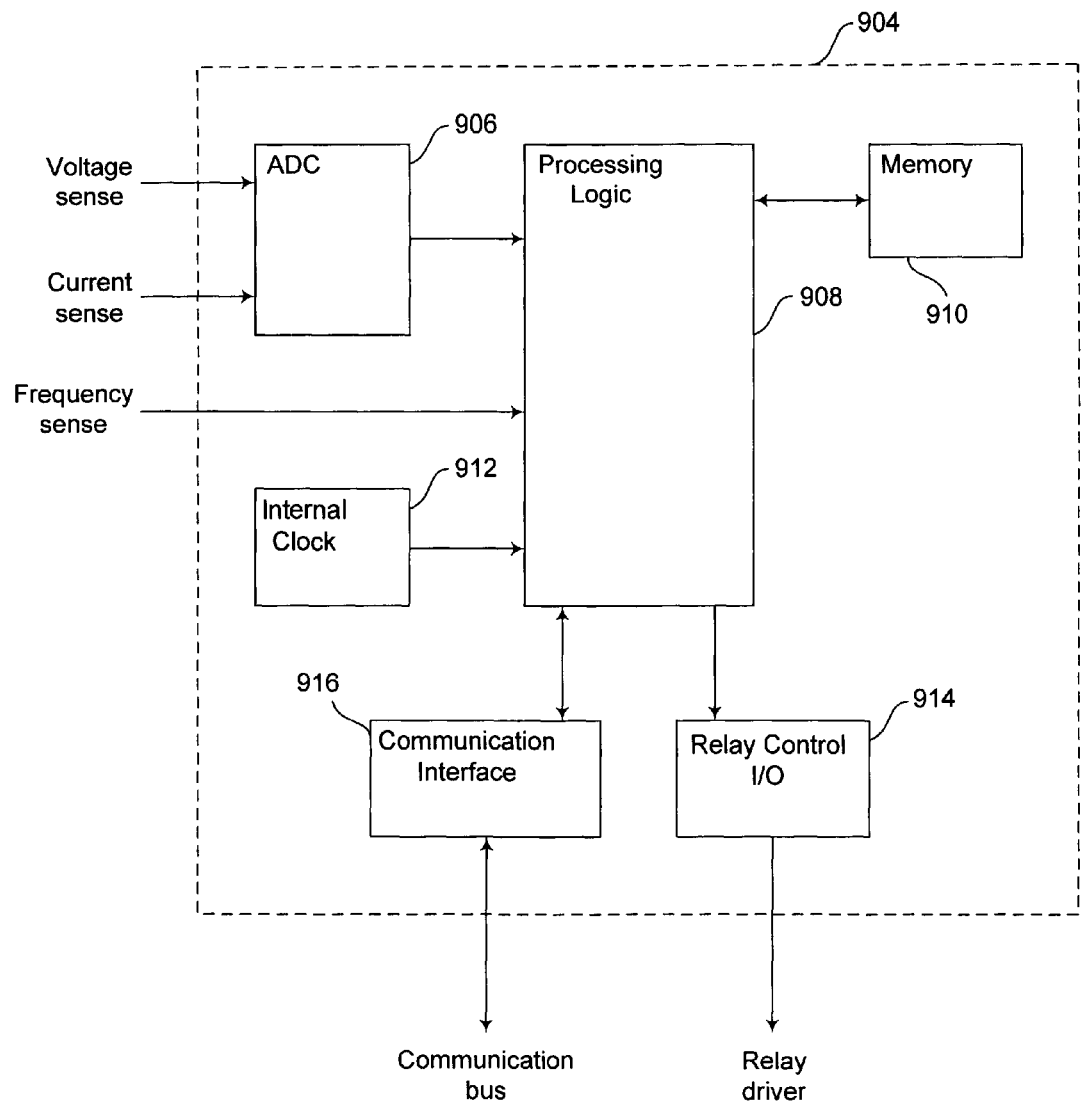
FIG. 9 is a block diagram illustration of a microcontroller of an exemplary embodiment.

With reference now to FIG. 9, a block diagram illustration of a microcontroller 904 is provided for an exemplary embodiment. The microcontroller 904, as mentioned above, includes an analog-to-digital converter 906 that receives an input from the current sensors and the voltage sensors. Samples from the ADC 906 are provided to processing logic 908. A memory 910 is interconnected to the processing logic 908 and may be used to store information related to power metrics and sampled current and voltage information, as well as any programming used by the processing logic. An internal clock 912 provides an internal time base, and as discussed above the processing logic 908 also receives a frequency sense signal that allows accurate synchronization with an AC cycle. The microcontroller 904 also includes a relay control 914 and a communications interface 916. The communications interface may be used to receive and transmit information to and from a communications bus, such as power metrics computed by the processing logic, control commands to actuate different relays through the relay control 914, etc.

Figure 10:
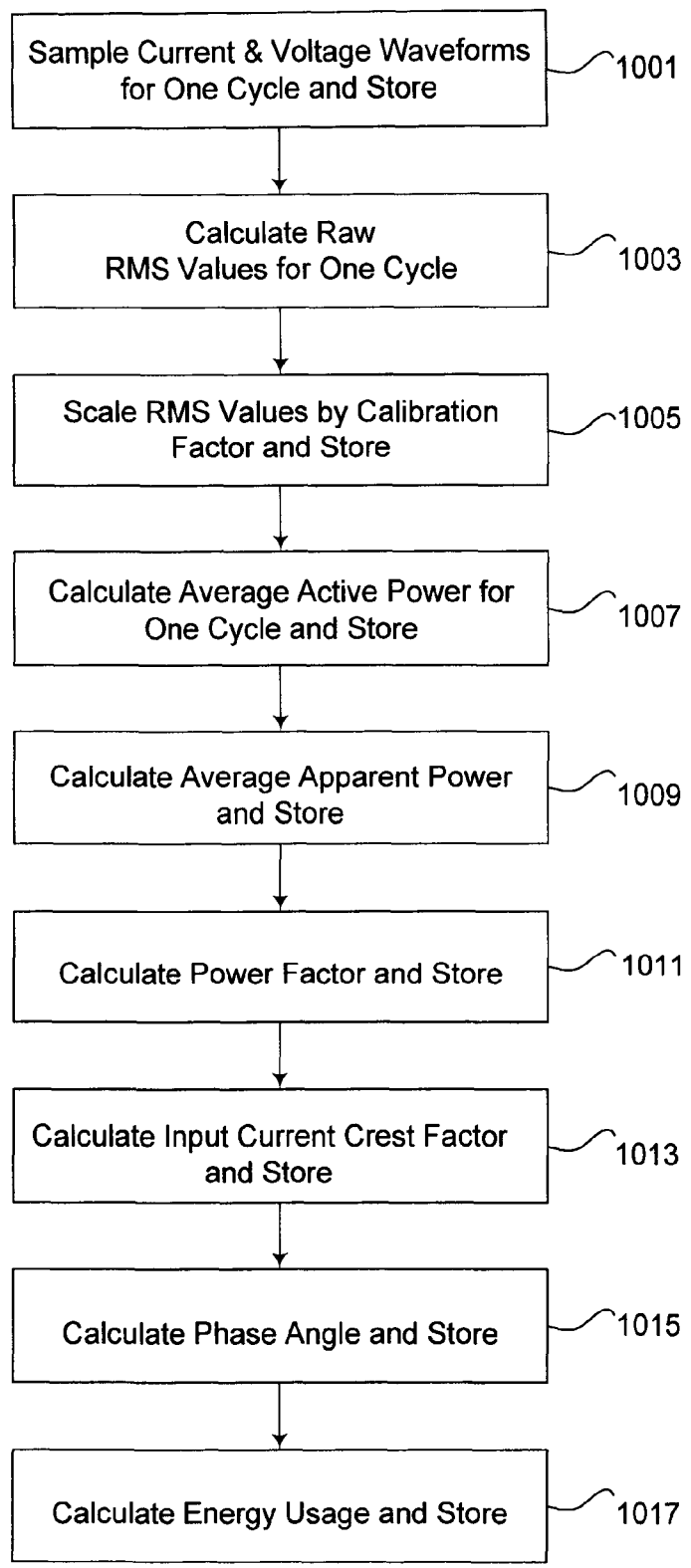
FIG. 10 is a flowchart illustrating the collection and computation of several parameters related to the monitored voltage and current of an exemplary embodiment.

With reference now to FIG. 10, the operational steps of a microcontroller for determining power metric related information are described for an exemplary embodiment. In this embodiment, the ADC 906 is a 10 bit ADC, with single-ended channels for voltage sense inputs and differential channels for current sense inputs. As mentioned above, 120 samples of voltage and current are taken for each cycle in an embodiment. Each of those samples, 120 over the AC cycle, are taken nearly simultaneously for both the current and voltage. In an embodiment, near simultaneity is achieved by successive ADC samples which are only microseconds apart, for a relatively small error effect on overall calculations.

The operational steps shown in FIG. 10 begin with sampling the current and voltage waveforms from the sensors for one input power cycle and storing the resulting digitized data (1001). Next, raw RMS values of the voltage and current are calculated (1003) and these raw values are scaled by a predetermined calibration value to obtain true RMS values which are then stored (1005). Average active power consumed during one cycle (1007), average apparent power (1009), power factor (1011), input current crest factor (1013), phase angle between voltage and current (1015) and energy usage (1017) are also calculated and stored.

Figure 11:
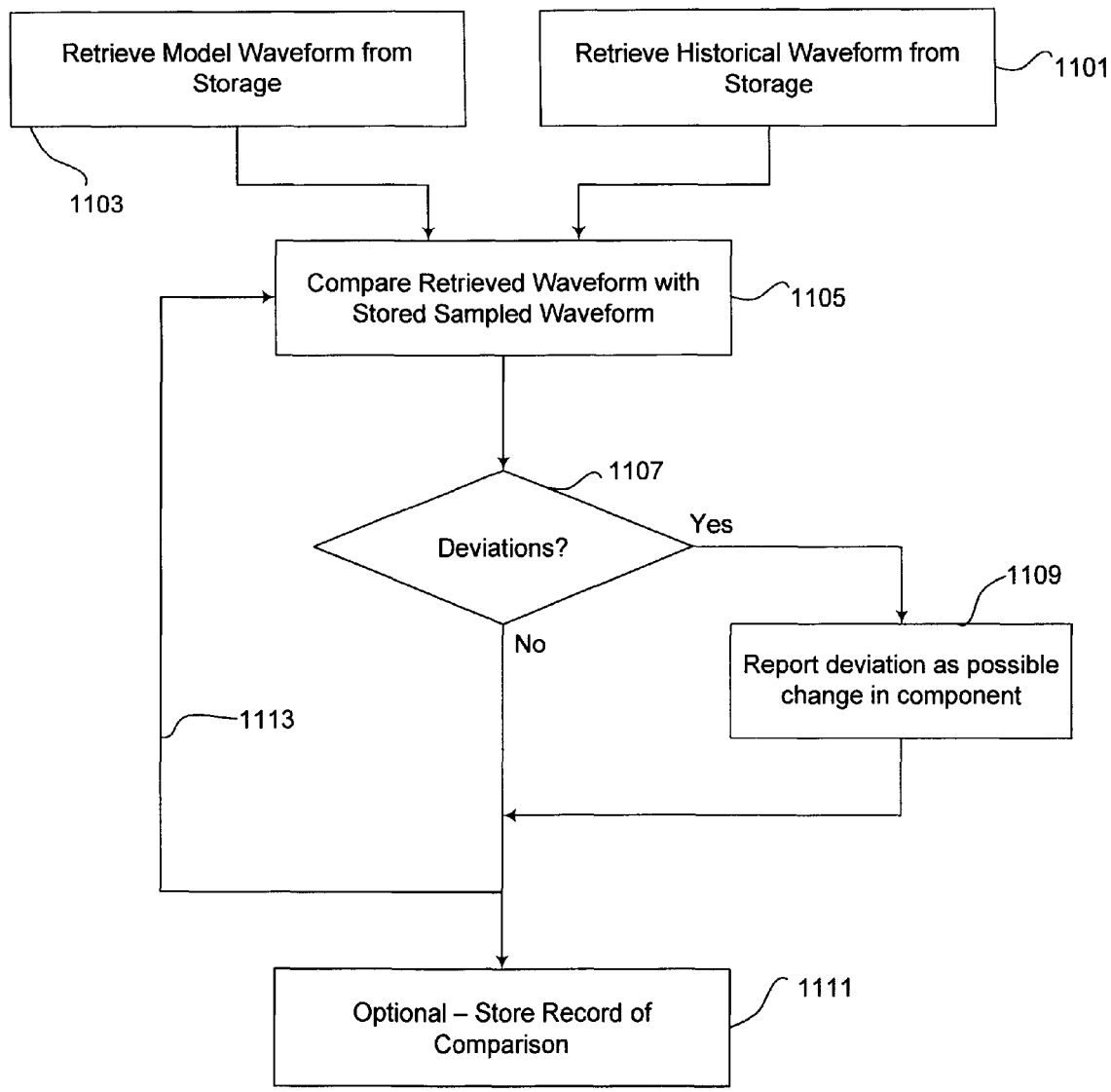
FIG. 11 is a flowchart illustrating comparison of voltage and current data with historical or model data.

FIG. 11 shows an embodiment of the invention in which voltage and current data are compared with historical data or with predetermined model data. If the voltage and current data are to be compared with historical data, the historical waveform data are retrieved from storage (1101). If a predetermined ideal model waveform is to be used, data representing that waveform are retrieved from storage (1103). Then the retrieved data are compared with the stored samples (1105) to determine if there are deviations (1107). If deviations exceed a predetermined threshold, for example if the stored samples representing the measured voltage and current show a waveform distorted beyond a predetermined limit, an unexpected power factor, too much or too little power being consumed, or the like, the deviation is reported (1109). A record of the comparison may be stored (1111). The process may be repeated as indicated by a line 1113 returning back to step 1105.

Figure 12:
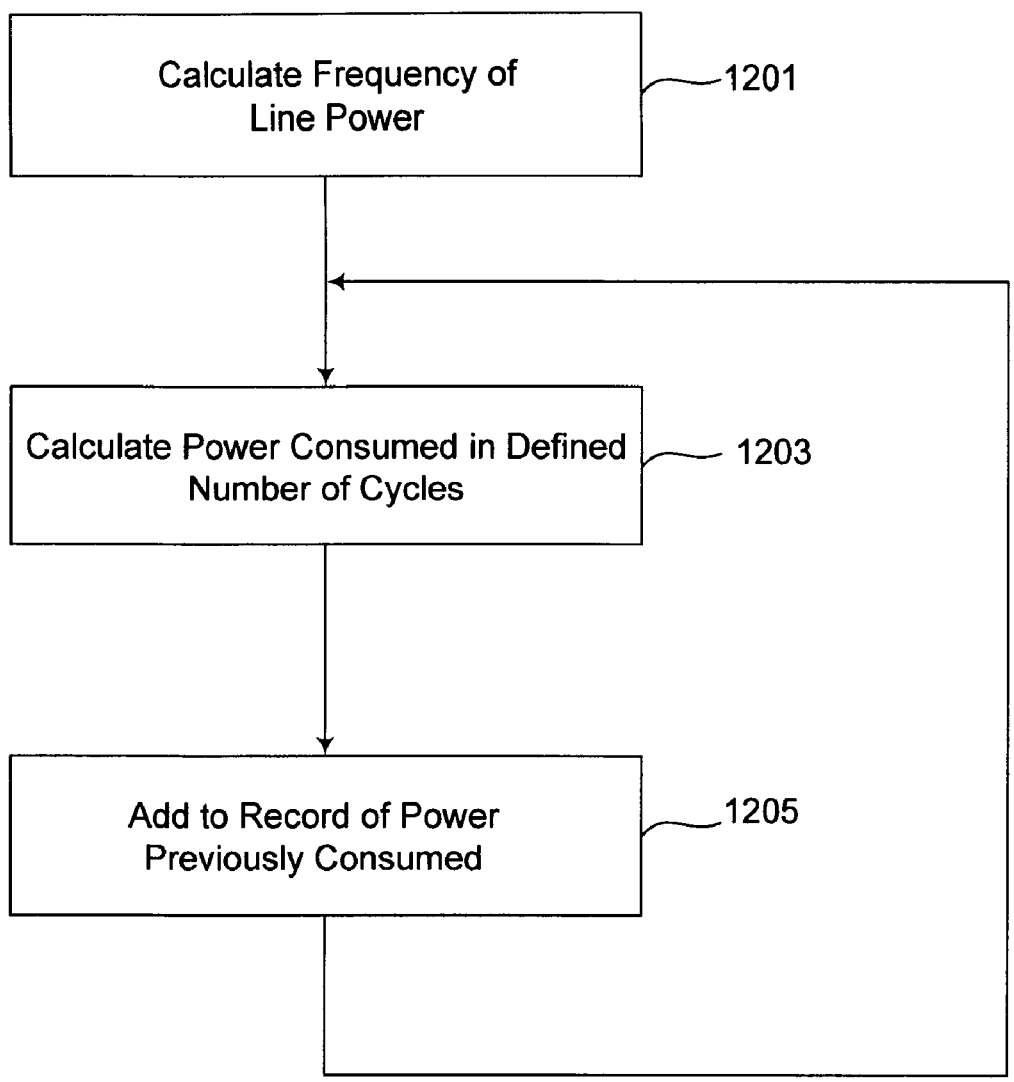
FIG. 12 is a flowchart illustrating summation of energy consumed over time.

FIG. 12 shows a summation over time of energy used. Power line frequency is calculated (1201), and the power line signal is thereupon used as a timing signal to accurately measure the time during which energy is being consumed. The power consumed in a defined number of input power cycles, for example 24 cycles in some of the embodiments discussed herein, is calculated (1203) and is added to a record of power already consumed (1205) to maintain a running total of the power consumed.

Figure 13:
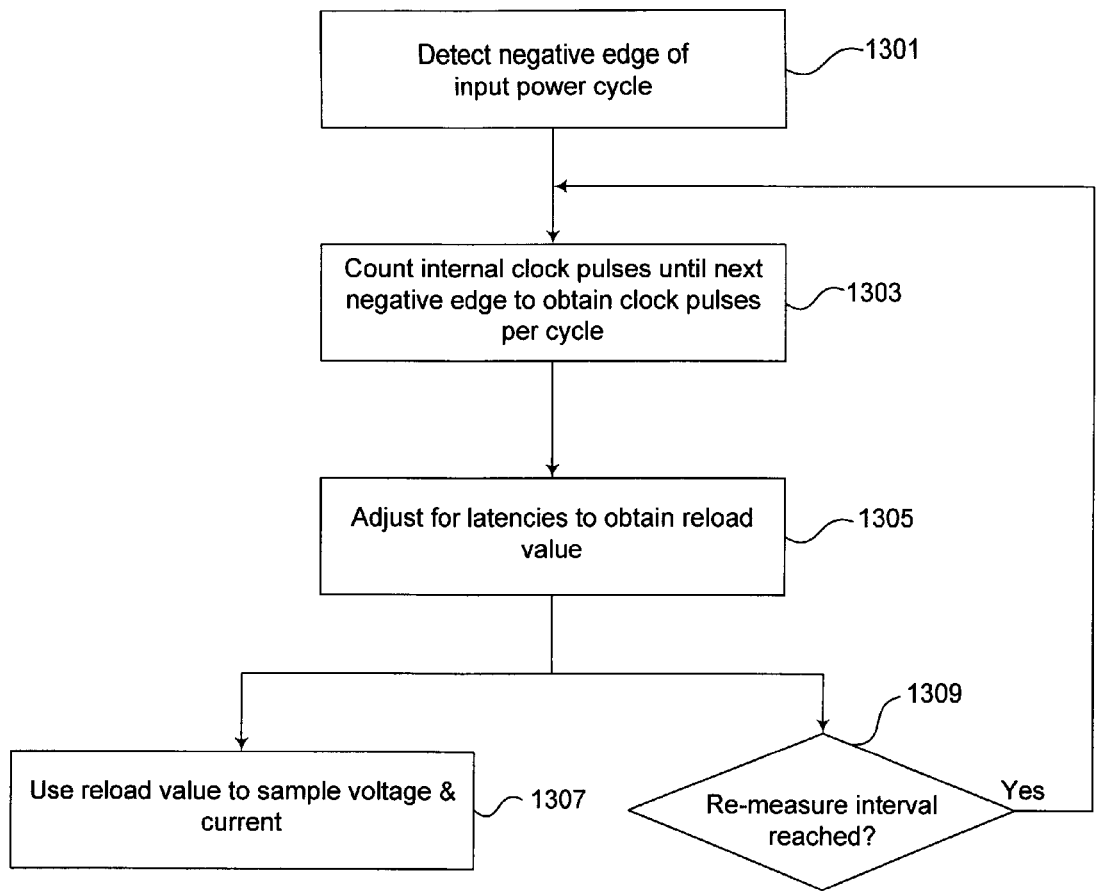
FIG. 13 is a flowchart illustrating use of power line frequency to generate reload values for use in determining sampling intervals.

FIG. 13 shows further use of timing information derived from the input power signal. Negative edges of the input voltage cycle are detected (1301) and the internal clock pulses between successive negative edges are counted (1303) to obtain the number of internal clock pulses per voltage cycle. This number is adjusted for system latencies and any known system errors to obtain a reload value (1305). The reload value is used as a timing basis for sampling the voltage and current as measured by the sensors (1307). When a predetermined interval has been reached, the number of clock pulses per cycle can be remeasured (1309).

The procedures illustrated in FIGS. 10 through 13 will now be described in more detail. Each voltage and current sample is stored in memory 910 as an integer value. For each set of current and voltage samples, the processing logic calculates the true RMS voltage and current in several steps. First, each data point in the 120 samples is summed together and then divided by 120 to get the mean of the samples, as a floating point value. Then, for each sample, the processing logic calculates the difference of that sample from the mean as floating point values. Each difference from the mean is squared, and the sum of the square of every point's difference from the mean is calculated. This total sum is divided by 120. The raw RMS value is then determined as the square root of the resulting quotient. This number is scaled by the calibrated scale factor to produce a calibrated value, referred to as a true RMS value, which is stored in memory 910 for both the set of the current data points and the set of voltage data points. The result is RMS current and the RMS voltage values. In this manner, an AC RMS value is generated that removes any DC offset present from the sensing circuitry or the signal itself.

In one embodiment, the samples of voltage and current in a waveform are compared against a model waveform or a historical waveform for that particular channel, and any significant deviations from the comparison may be flagged as anomalous indicating that there has been a change related to the associated component. Such a change may indicate the component may not be operating properly, may be about to fail, or may have had a failure. For example, waveforms of the current drawn by a device and the voltage drawn by the device, when compared to historical or reference waveforms, may indicate a fault or other condition that should be investigated. For example, a switched-mode power supply located within a server that receives power from a PDU may be drawing power in a manner that indicates an imminent failure. Embodiments described herein provide the ability to assess the health of such power supplies in an installed base of power supplies in data center equipment racks without requiring any modification of the power supplies.

In some embodiments, currently sampled waveform information is only maintained in memory long enough to be utilized to generate and report the noted power metrics. Other waveforms, however, may be maintained in memory for comparison, such as in the form of or representative of one or more sample or reference waveforms or portions of one or more waveforms. In addition, the waveform information might be maintained in memory longer or otherwise stored for later use in, e.g., providing a basis for comparison. For example, when a system is initially set up and tested, the waveform may be stored and used for later comparison.

Referring again to FIG. 10, power for each cycle is determined by first, for each of the 120 data points for current and voltage, calculating products of each respective sample. These 120 products make up the waveform of the wattage that may be compared to model or historical waveforms to identify any potential problems related to the component that is receiving power from the associated outlet. The sum of the products of each current and voltage data point is then divided by 120 to get the average power, referred to as active power. It is noted that, in this embodiment, zero-phase toroidal current transformer are used and the voltage and the current samples are digitized approximately simultaneously, and thus the phase angle created by loads is inherent in this measurement. This phase angle may be determined as the inverse cosine of the power factor, as will be described in more detail below.

Also calculated is apparent power, which is the product of the RMS current and the RMS voltage calculated earlier, having units of volt-amps or VA. Power factor, the ratio of the active power to the apparent power, is calculated, which directly relates to the phase angle difference between the current and voltage. Power factor is calculated by taking the active power calculated from all the data points divided by the apparent power, which was the product of the RMS current and voltage. The next item calculated in this embodiment is current crest factor. The current crest factor is the ratio of the peak of the current waveform to the RMS of the current waveform.

Finally, energy is calculated. As mentioned above, embodiments are provided in which the microcontroller does not receive a time base from an external oscillator. The timing for such embodiments is based on cycles of the incoming AC waveform. As is well known, frequency of incoming AC power is generally 50 Hz or 60 Hz, depending upon location. Furthermore, most, if not all, industrialized nations have electrical generation and distribution systems that provide a relatively stable frequency of incoming AC power. The stability of incoming AC frequency may be used to provide a relatively accurate timing mechanism for starting and stopping ADC conversions. As described above, one embodiment samples eight channels over the course of 24 AC cycles. The relative accuracy of the incoming AC signal as a time base provides knowledge that there is an accurate measuring every 24th cycle for each channel with very little drift.

In an embodiment, the input power signal is sampled to determine if the input power is 50 Hz or 60 Hz. At 60 hertz there are 216,000 cycles in an hour, and at 50 hertz there are 180,000 cycles in an hour. With this information, and the measurement of one current channel every 24 cycles, energy may be calculated by multiplying the active power times 24, representing the total of all 24 cycles between measurements on a channel, and dividing by either 180,000 (at 50 hertz) or 216,000 (at 60 hertz). This provides a representation for power consumed by the channel during the 24 cycles. This energy computation is added to an energy accumulator associated with each channel. Each time the power for a channel is computed, the wattage use for the represented 24 cycles is added to the accumulator. In one embodiment, to reduce floating-point significance and rounding errors, when the accumulator (a floating point data type in memory) exceeds one, the accumulator is decremented and a double word integer associated with the channel is incremented to provide a number representing whole watt hours that have been measured for the channel. All of the values stored in memory may be reported through the communication interface to power managers or other applications that may then use this information to provide a number of different power-related metrics for components that receive operating power from the PDU.

As discussed above, relatively accurate timing is achieved in embodiments with a relatively high variability internal microcontroller clock though adjustments that compensate for inaccuracies in the internal clock. The compensation is achieved, in an embodiment, through providing the frequency sense input into an external interrupt pin on the microcontroller. The frequency sense signal, as discussed above with respect to the embodiment of FIG. 7, may be generated from a photo-optic diode 824. As the voltage rises on the input power, the LED of the photo-optic diode turns on, and the LED will turn off slightly above the zero crossing of the input waveform, regardless of the duty cycle. As a result, every second edge of the frequency-sense signal is the frequency of the line input. The microcontroller, in this embodiment, is programmed to identify a positive edge of the frequency sense signal.

Once a positive edge is identified, then the first negative edge is identified. The interrupt within interrupt service routines for the external interrupt pin in the microcontroller is set to high priority to have relatively few, if any, interruptions from any other software interrupt service routines. When the first negative edge is detected, the microcontroller starts running a counter that counts every 12 clocks of the internal clock 912. In one embodiment, the internal clock 912 is nominally a 24.5 megahertz internal clock plus or minus 2%. The timer runs until the next negative edge is detected. Thus, regardless of the timing of the internal clock 912, a number of system clocks is determined that represents the span of time, from the microcontroller's view, of a single AC cycle. This number is converted into entire system clocks for an AC cycle by multiplying by 12, and then divided that by the number of samples collected within a single AC cycle (120 in this embodiment). Thus, a number of clocks is calculated that represents the time span for each sample of an AC cycle. This time is adjusted for expected interrupt latencies in the microprocessor, due to known entry and exit times in the interrupt service routines, etc., to generate a number of system clocks that represents the AC cycle. This value becomes a reload value for the timer that starts off each ADC conversion.

Thus, the timer becomes a time base for the digitizer of the ADC, and continues to be the time base for cycles when digitizing is not performed. Errors in the time base may accumulate over time. In one embodiment, errors are reduced by periodically re-measuring the number of system clocks in an AC cycle, such as once every five seconds. Such re-measuring provides adjustment to account for the actual speed of the internal clock, which is susceptible to temperature change, and also synchronizes the timer to a zero crossing of the voltage waveform. Such timing and synchronization of timers to an AC cycle provides relatively accurate power metrics. For example, if an external crystal time base were used, which is also susceptible to temperature change and variability of the incoming AC signal, errors can be introduced in between the timing of AC cycles and also synchronization to AC cycles. In the embodiments described here, the timer is re-synced to provide greater confidence that the samples used for RMS calculations are within the actual AC cycle. If RMS calculations are based on samples that begin after the cycle begins, or that end after the end of the cycle, error can be introduced to report either less or more energy than is being integrated. By re-syncing, sampling is more likely to be within a cycle and not outside the cycle, and thereby improves accuracy.

As mentioned above, to determine energy, an accurate measure of time is needed to provide, for example, a watt-hours number. The above description relies on the assumption of 50 or 60 hertz input signal being accurate. In some embodiments, the time as measured in the microcontroller is compared to time provided by a network controller to verify or adjust energy calculations. In one embodiment, the number of cycles counted in a timeframe of an hour is provided to a network card and compared to an actual real time clock view of an hour. In the event of any significant deviation, the network card may add a simple correction scale in for that. For example, if the microcontroller counts up number of clock cycles in an hour and reports to the network card, which measures 59 minutes, a simple adjustment may be made to the energy value.

In another embodiment, the timing of the AC cycles provides an indication related to when the incoming power waveform is at a zero-crossing. In this embodiment, the switching on and off of the relays (such as in FIG. 5) is performed around the zero-crossings on the voltage AC waveform, or at least at a point less than the peak value of the waveform. Such switching acts to reduce noise from the relays when switching, and may also extend the life of the relays. Reduced noise results, in part, because switching at a zero-crossing results in relatively low, or no, voltage potential at the physical points within the relay, thereby reducing noise when the relay is switched. Furthermore, the point life of such relays may be extended due to lower stress than would be present when switching occurs with a relatively high voltage present at the relay. A further advantage of switching at or near zero-crossings is a reduction in the in-rush currents experienced by a piece of equipment. For example, if the points on a relay are closed as the top of the sine wave, the in-rush current would be significantly higher than present if switching is performed at or near a zero-crossing. In this manner, the entire chain of current path is also less stressed.

While described above with respect to a CDU, it will be understood that the power measurement circuitry and portions thereof have many applications beyond the exemplary embodiments described above. For example, a low-cost power metering circuit such as described may be incorporated into other equipment to provide information related to power parameters for the particular equipment. A server may, for example, include a power circuit as described to provide power-related information that may be used to assist in managing efficiency of the server by, for example, identifying that a server is not operating efficiently and that the load being serviced by the server may be a target to be moved to a different server. Similarly, it has been desired to have a switched-mode power supply that provides power-related information, but there is a strong desire to maintain as low a cost for these power supplies as possible. A single-chip solution without an external oscillator time base as described herein may provide a low-cost solution for incorporation into such power supplies. Further, such power metering may be incorporated into residential, commercial and/or multiple-unit power meters to provide power-related information for billing purposes.

With reference again to FIG. 7, as mentioned above an outlet module may include power outputs that are connected to separate line inputs. In such cases, separate voltage sensor circuits 800 are used for each set of outlets. Separate voltage sense circuits for each branch of outlets may be desired for a number of reasons, such as separate branches protected by different fuses or circuit breakers, and one branch may have a fuse blown or the circuit breaker tripped and it could be off while power is still being supplied to the other outlets on the second branch. Also, those two branches may be operated at different voltages, for instance in a three-phase 208 volt wye system where both 208 volt AC (line to line) and 120 volt AC (line to neutral) may be present and required to be on separate branches. Two volt sense circuits 800 allow the two different voltage values in that split branch configuration to be measured and used in power metric calculations. Also, the on-sense may be used to detect an absence of voltage that may result from many different sources, one being a fuse or circuit breaker that has faulted. In cases where an on-sense signal is provided at the power cord input, it can be determined whether the line has failed or a fuse has blown.

As discussed above, the microcontroller 904 is interconnected to a communications bus (such as an I2C bus or SMBus). The microcontroller 904 reports over the bus, for each outlet/channel: (a) Voltage RMS (Vrms)—the pseudo-running-average of the eight most-recent Vrms values reported to a tenth volt; (b) Current RMS (Irms)—the pseudo-running-average of the eight most-recent Irms values reported to a hundredth Ampere; (c) Apparent Power (VA)—the pseudo-running-average of the eight most-recent VA values reported to in volt-amps; (d) Active Power (W)—the pseudo-running-average of the eight most-recent active power values reported in watts; (e) Power Factor (pF)—the pseudo-running-average of the eight most-recent pF values reported to a tenth; and (f) crest factor. This data may be received by an external system that collects the outlet information for which the data is provided, and used to determine metrics or provide information such as described above.

Figure 15:
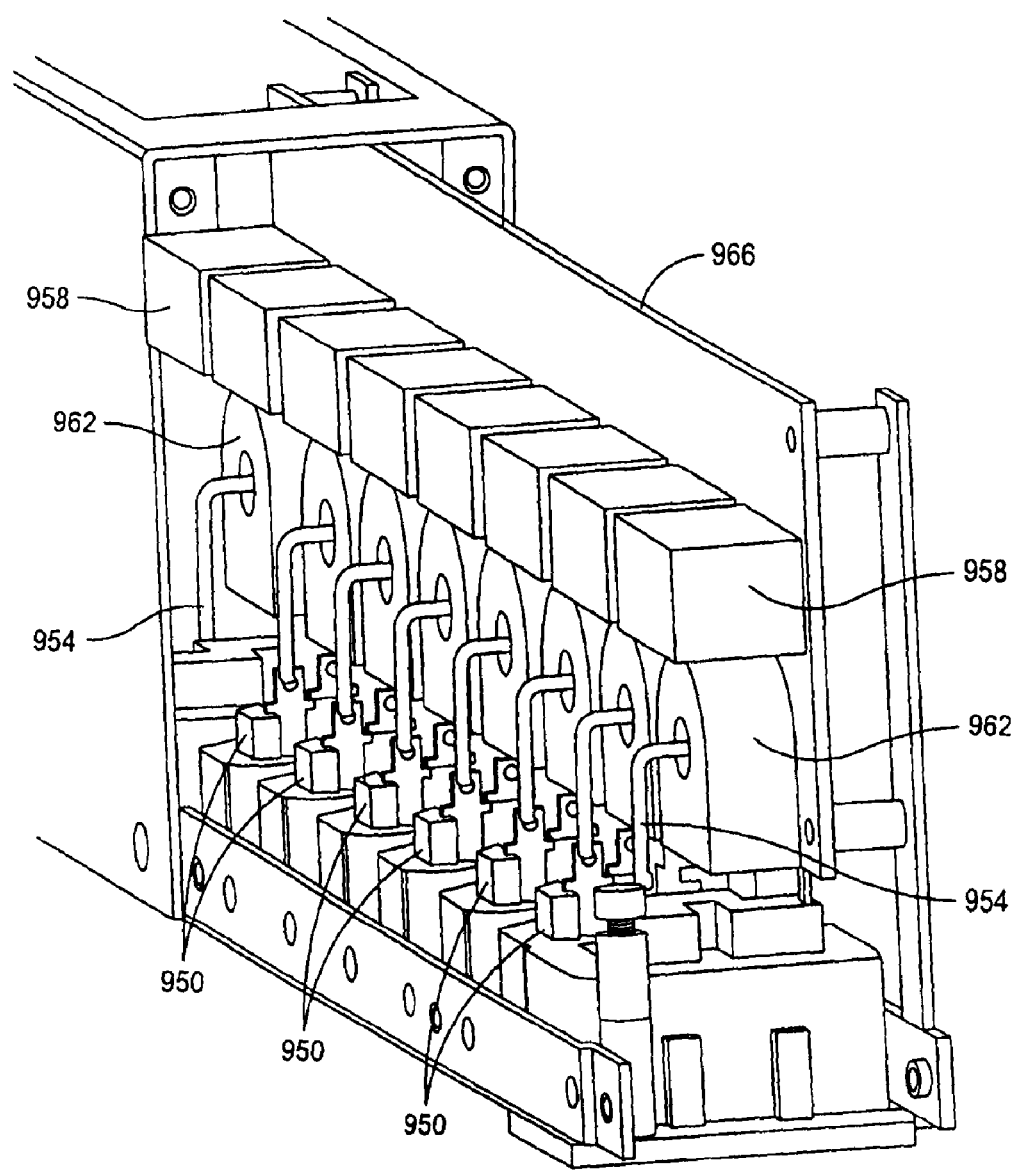
FIG. 15 is an illustration of a single printed circuit board PDU assembly of an embodiment.

FIG. 15 is an illustration of a single circuit board configuration of an embodiment. In this embodiment, the components described above with respect to the three circuit boards as illustrated in FIGS. 4-8 are provided on a single circuit board. In this embodiment, power outlets 950 are provided that have a neutral line and a ground that are provided by a bus bar (not shown). The line power is provided to outlets 950 through a line connection 954 that is routed through a relay 958 and an associated current transformer 962. The relays 958 and current transformers 962 are interconnected to control and monitoring circuitry such as illustrated in FIGS. 4-8. In this embodiment, the printed circuit board 966 is mounted at a 90 degree angle relative to the plane of the outlets 950. In this manner, the additional surface area required by the circuit board 966 is provided in a plane that is generally perpendicular to the plane of the outlets 950, rather than in a parallel plane as illustrated in the embodiment of FIG. 14. By configuring the circuit board 966 perpendicular to the plane of the outlets 950, this additional surface area can be accommodated simply be making the PDU housing somewhat deeper, with the width of the housing remaining substantially the same as the embodiment of FIG. 14. Using a single printed circuit board 966 allows a reduced manufacturing cost and provides efficiencies in manufacturing due to reduced assembly steps relative to embodiments with more than one printed circuit board.

Those of skill will appreciate that the various illustrative logical blocks, modules, circuits, and algorithm steps described in connection with the embodiments disclosed herein may be implemented as electronic hardware, computer software, firmware, or combinations thereof. To clearly illustrate this interchangeability, various illustrative components, blocks, modules, circuits, and steps have been described above generally in terms of their functionality. Whether such functionality is implemented as hardware, software, and/or firmware depends upon the particular application and design constraints imposed on the overall system. Skilled artisans may implement the described functionality in varying ways for each particular application, but such implementation decisions should not be interpreted as causing a departure from the scope of the present invention.

For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. For a firmware and/or software implementation, the methodologies may be implemented with modules (e.g., procedures, functions, and so on) that perform the functions described herein.

Figure 16:
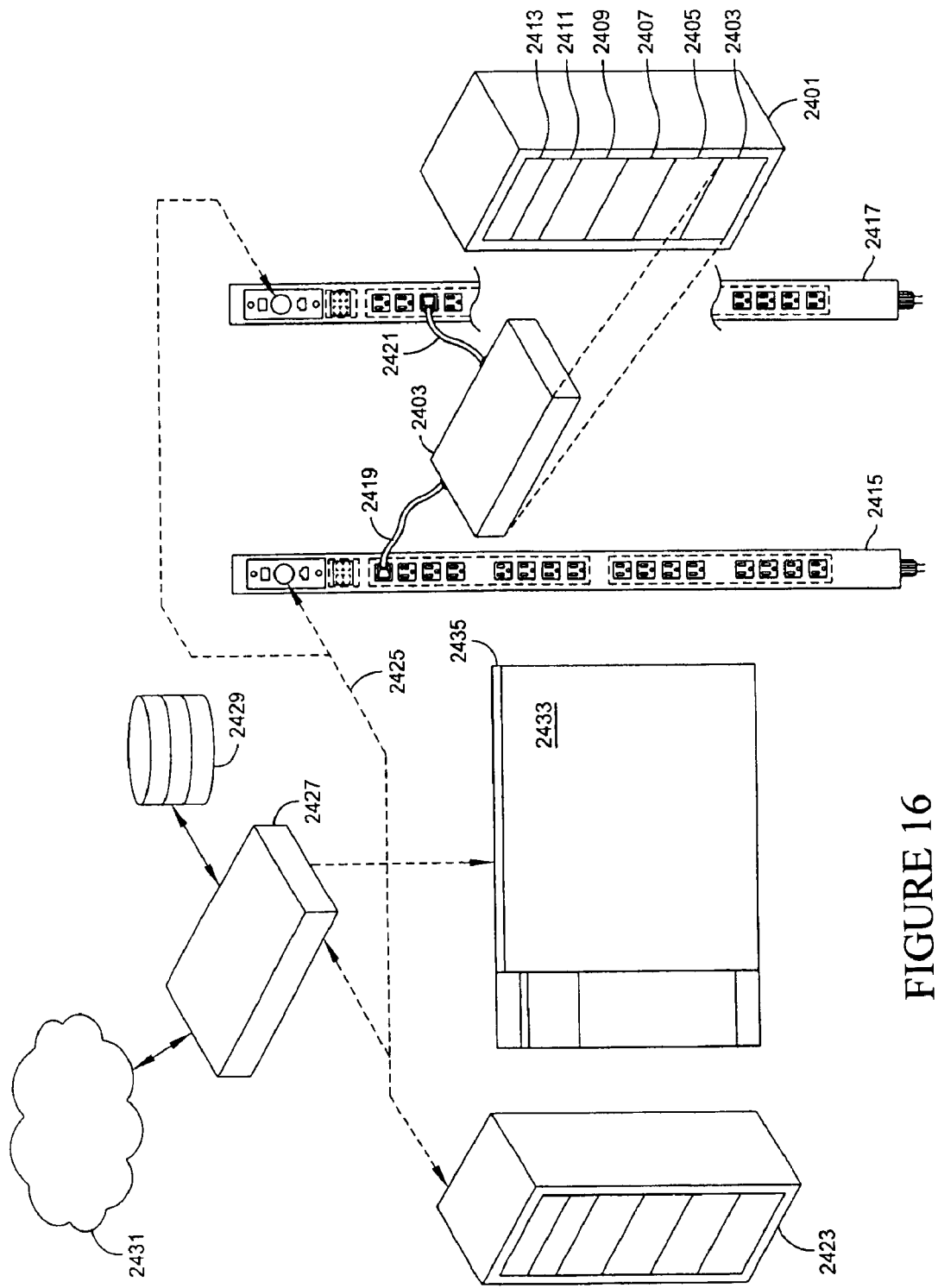
FIG. 16 is a block diagram of a power management system embodying aspects of the invention.

A power management system embodying aspects of the invention is illustrated in FIG. 16. A first equipment cabinet 2401 houses components 2403, 2405, 2407, 2409, 2411 and 2413. Also in the cabinet are a first CDU 2415 and a second CDU 2417. The CDUs are shown outside of, and larger than, the cabinet for convenience. Each CDU is similar to the CDU depicted in FIG. 2. The component 2403 is shown both installed within, and outside of, the cabinet. The component 2403 draws power from both CDUs as indicated by a cord 2419 connecting the component 2403 to an outlet in the first CDU 2415 and a cord 2421 connecting the component 2403 to an outlet in the second CDU 2417. Others of the components may be connected to one or both of the CDUs as desired.

Similarly, a second equipment cabinet 2433 houses various components and one or more CDUs that provide power to these components. The system may include other equipment cabinets having more or fewer components or CDUs than depicted in the drawing.

The CDUs in the various cabinets communicate, for example through an Ethernet pipeline 2425 or through the Internet or some other suitable medium, with a server 2427. The server 2427 includes a database 2429 which may be stored in a memory, or on a magnetic disk or other medium. The database 2429 may be located in one place or distributed as desired. In some embodiments the server 2429 communicates with another system such as a Building Management System 2431.

As discussed previously, various electrical parameters respecting one or more of the outlets may be measured and used in managing power throughout the system. Current flow through each outlet, voltage present at the outlets, power factor, real and apparent power flowing through each outlet, phase angle between voltage and current at each outlet, accumulated energy for each outlet, power line frequency, and the like may all be measured and the measurements communicated to the server for presentation to a user or for preparing reports, generating messages, providing trends, and the like.

While embodiments discussed above describe exemplary implementations of components within an equipment rack or CDU, one or more of the principles, aspects, or features described above may be used in other applications. For example, generation of power metrics as described above, as well as internal clocking based on an incoming AC signal, may be incorporated in or with a power supply, such as a switched-mode power supply, to provide metrics related to the power supply or to otherwise use them or the underlying operation or information monitoring in association with the power supply or associated components or systems. For example, in this fashion such a power supply may monitor itself, take corrective or other action based on (in whole or in part) internal monitoring, and/or report out one or more power metrics. Such metrics may be used, for example, to anticipate power supply failure, measure power supply efficiency, and/or adjust the power supply to be more efficient for a given load.

Figure 17:
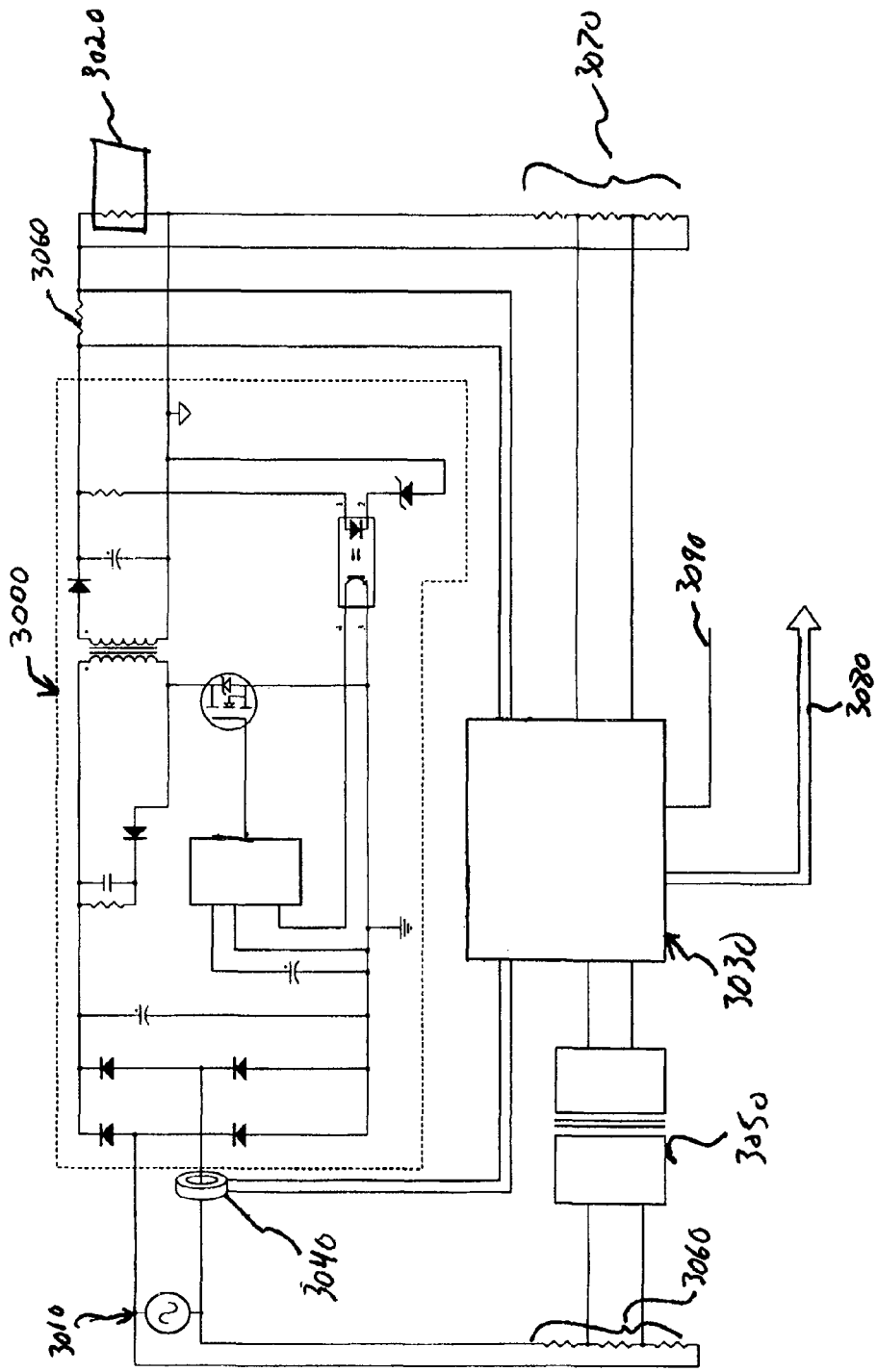
FIG. 17 is a schematic diagram of an embodiment that provides power monitoring of an installation having a switch mode power supply.

With reference now to FIG. 17, an embodiment illustrating power monitoring incorporated within a switch mode power supply is illustrated. In this embodiment, a switch mode power supply 3000 receives incoming AC power from an AC line source 3010. This embodiment includes voltage and current monitoring for both the high side, that is the high voltage AC input power, and the low side that is the relatively low voltage DC output from the switch mode power supply 3000. The switch mode power supply 3000 is used to provide power to a load 3020, which may be any device or asset that receives power from the switch mode power supply 3000. The load 3020 is modeled as a resistive load in this illustration, although it will be readily recognized that such loads are not necessarily purely resistive loads, and in many cases if the load is operating at less than optimal conditions, the load 3020 may be a reactive load or have a larger reactive component relative to a load operating at optimal conditions.

A microcontroller 3030 receives an input from a toroidal current transformer 3040 associated with the high side AC power source. The output of the current transformer 3040 indicates the instantaneous magnitude of the current that is flowing through the input AC line, and may be configured such as the current transformers described above. The output of a voltage sense circuit 3050 is also received at the microcontroller 3030. The voltage sense circuit 3050 may include an isolating amplifier that amplifies voltage from a voltage divider network 3060, and may also include a frequency sense output such as described above.

The microcontroller 3030 of this embodiment also receives input related to low side current and voltage. Current from the low side may be input through a shunt resistor 3060 having a known resistance, the voltage across this shunt resistor 3060 used to calculate the current provided to the load 3020. Low side voltage is provided from a voltage divider network 3070. It is noted that the low side current and voltage sense signals are not isolated signals, as these signals in this embodiment have relatively low voltage levels that do not require isolation. It will be understood that necessary isolation may be achieved according to many common methods. The microcontroller 3030 operates to collect information related to the voltage and current inputs and may process and output information in manners such as described above to provide power metrics related to the switch mode power supply 3000. The output from the microcontroller 3030 may be through a communications buss 3080 as illustrated in FIG. 17, although other communication may be utilized such as wireless communications. The microcontroller 3030 of this embodiment also provides a control output 3090 that may be used to control one or more other components associated with the switch mode power supply 3000.

For example, typical power supplies are most efficient, when in good operating order, at a load of 80-90% of standard capacity. In the event that a power supply load is only 60% of capacity, and the load appears static, the power supply could itself adjust internally, based on the load, to be more efficient. Embodiments such as described above can provide the metrics or underlying measurements (e.g., waveform comparisons) to trigger the adjustment. The power supply can also include a remote reporting capability to report out information.

Additionally, in certain other embodiments, generation of power metrics as described above and internal clocking based on an incoming AC signal, are incorporated into other types of appliances other than computing-related equipment, such as household computer, TV, stereo, and/or other appliances. Such appliances may use the information to adjust internally based on load and/or report out problems, power metrics, etc. Such communications may be through a wired or wireless communications interface to a remote power manager interconnected, for example, to the smart grid. In some embodiments, the power supply calculates only some, or none of the above noted metrics, but uses this type of monitoring to take action.

Figure 18:
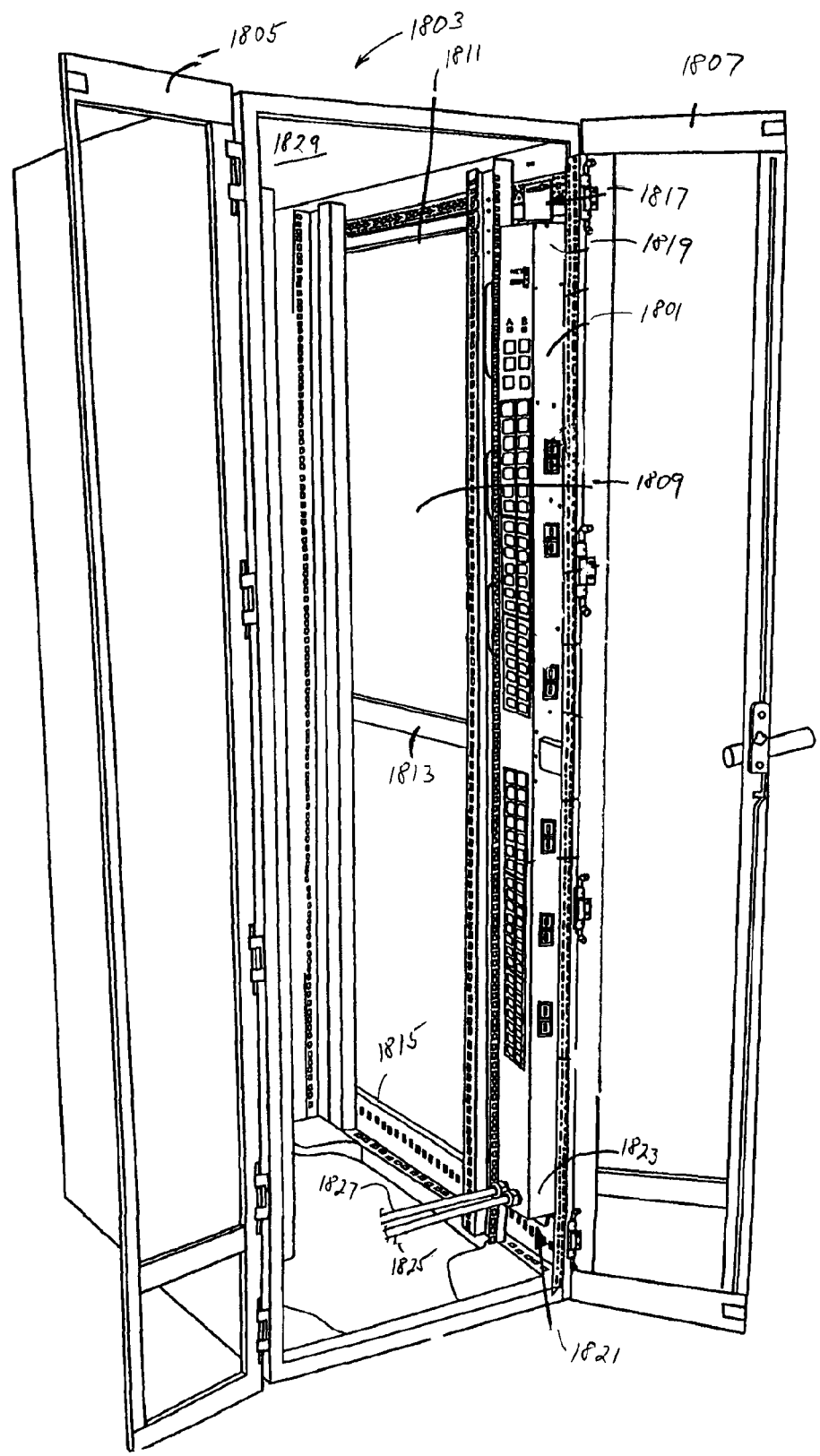
FIG. 18 is a pictorial representation of a power distribution unit according to an embodiment installed vertically in an equipment rack.

As shown in FIG. 18, in some embodiments a power distribution unit 1801 is adapted for vertical mounting in an equipment rack 1803. The rack 1803 has a first back panel 1805 and a second back panel 1807 shown in open position revealing the interior of the rack as seen from the rear. The unit 1801 is installed vertically against a side panel 1809. In the rack shown, the side panel 1809 includes an upper horizontal member 1811, a middle horizontal member 1813 and a lower horizontal member 1815, and the unit 1801 is mounted to one or more of these horizontal members. For example, an upper bracket 1817 connects an upper extremity 1819 of the unit 1801 to the upper horizontal member 1811 and a lower bracket 1821 connects a lower extremity 1823 of the unit 1801 to the lower horizontal member 1815. First and second power inputs 1825 and 1827 are positioned out of the way of any electrical components that may be installed in the rack, penetrating the lower extremity 1823, although these power inputs could be located elsewhere as convenient.

In some embodiments a power distribution unit is adapted for horizontal mounting using appropriate hardware for attachment to a horizontal surface, for example an underside of an upper panel 1829 or between the lower horizontal member 1815 on one side of the rack and a corresponding horizontal member (not shown) on the other side of the rack.

Figure 19:
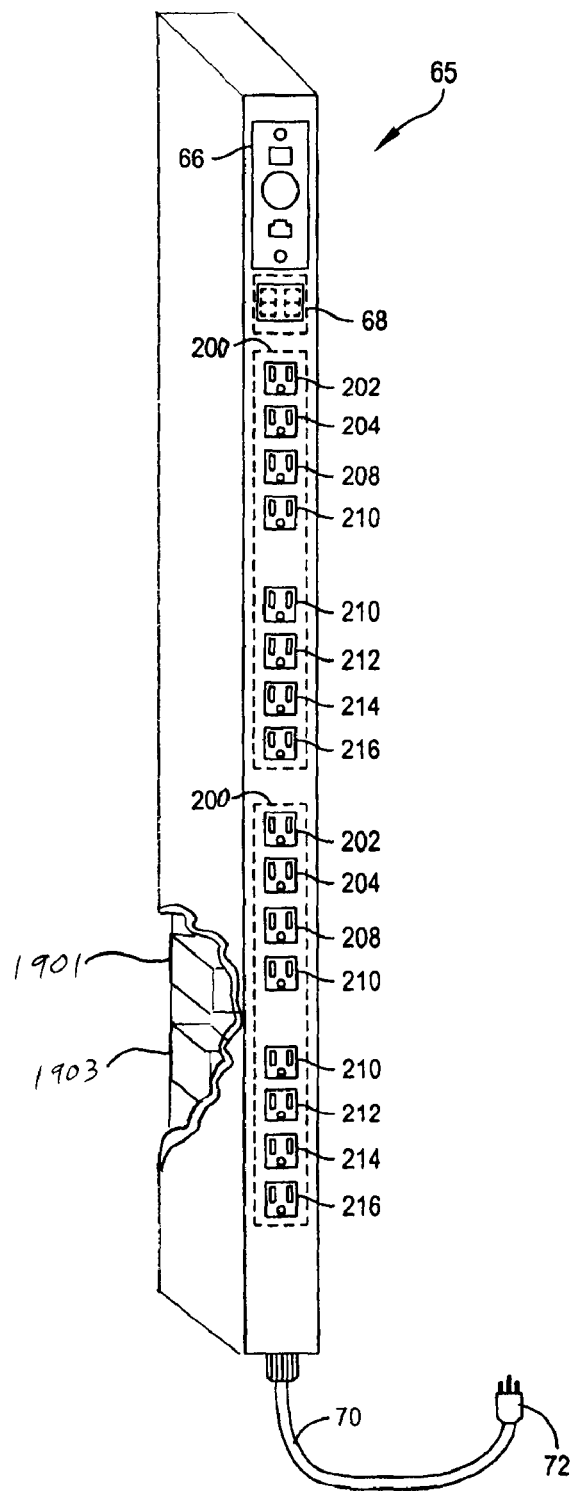
FIG. 19 is a partial cut-away view of an embodiment.

As shown in FIG. 19, in some embodiments a power distribution unit housing 65 is disposable in an electrical equipment rack of the type in which a plurality of electrical components are removably mountable. As discussed previously, an example 1803 of such a rack is shown in FIG. 18, although many other models of equipment rack might also be used. The embodiment shown in FIG. 19 is in some respects similar to the embodiment shown in FIG. 2, and items in FIG. 19 that are similar to items in FIG. 2 have like reference numerals and will not be further discussed. In the embodiment shown in FIG. 19, a power input 70 penetrates the housing 65; a plurality of power outputs 202-216 are disposed in the housing; a processor 1901 is disposed in the housing; a voltage calculation procedure 1903 is communicable with the processor; a voltage sensor (not shown) is communicable with the power input and the processor; and a plurality of current sensors (not shown) are communicable with the power outputs and the processor The voltage sensor and current sensors may be similar to the voltage sensor 52 and current sensors 56, respectively, as shown in FIG. 1. The processor 1901 may be implemented as a microprocessor, as an analog-to-digital converter and an arithmetic logic unit, or other devices. The voltage calculation procedure may be implemented as computer instructions stored in memory, firmware, an application-specific integrated circuit (ASIC), or other device. The voltage calculation procedure may for example be an RMS calculation procedure. In some embodiments the voltage calculation procedure is disposed in the housing as shown, and in other embodiments the voltage calculation procedure is located elsewhere. Similarly, the voltage and current sensors may be disposed in the housing or elsewhere.

In certain embodiments, assets that receive power from a PDU include power supplies having such power measurement and reporting circuitry. The PDU includes a communication interface (wired or wireless) and receives power supply metrics from each unit of supported electronics equipment through the communications link. The PDU can utilize and/or report the metrics to other remote entities.

The phrase "Per Outlet Power Sensing" ("POPS") refers to the concept of monitoring power consumption at each outlet as discussed above. With an Internet interface, monitoring power consumption at each outlet provides detailed power information and allows grouping of outlets to determine kilowatt consumption per device, group of devices, CDU, or cabinet. Power consumption can also be determined per rack, rows of racks, an entire data center, or the like by clustering outlet information across multiple IP addresses and CDUs, as discussed above. This can provide consolidated CDU information within a data center or across multiple locations, a centralized location to view power and environmental status, capacity planning, reports and trends, multiple views, auto discovery of all CDU devices, alarm details, an ability to manage CDUs, global or individual outlet control, and logging.

In can thus be seen that embodiments provide a number of novel features and advantages including, for example: (a) sensing and output of information related to the current and voltage output to various different components and/or applications; (b) an AC input clock compensation solution integral to a microcontroller, in which a power monitoring circuit and/or power meter does not require an external oscillator for a time base; (c) predictive failure of various power components; (d) an accurate energy accumulation scheme for one or more outputs associated with a single power monitoring and metering circuit; (d) output switching capability with relatively low power requirements using switching versus holding transistors in relay circuits used to switch the outputs; (e) output switching at zero voltage crossings in the AC power cycle; (f) modular construction of an outlet assembly with options to provide switched outputs or non-switched outputs; (g) the ability to determine if lack of power at an outlet is the result of loss of input power or a blown fuse and (h) the ability to assess the health of power supplies in an installed base of power supplies in data center equipment racks without requiring any modification of the power supplies.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

We claim:

1. A power distribution unit comprising:
   a power distribution unit housing;
   a power input penetrating the housing;
   a voltage sensor;
   a plurality of power outputs disposed in the housing, each in electrical communication with the power input and each connectable to a respective electrical load;
   a plurality of current sensors, each in electrical communication with one of the power outputs; and
   a power monitoring section having an analog-to-digital converter (ADC) in electrical communication with the voltage sensor and the current sensors, processing logic in electrical communication with the ADC, and a memory in electrical communication with the processing logic;
   wherein the ADC is responsive to signals provided by the sensors to sample the signals and obtain samples of voltage and current over more than one cycle of input power;
   wherein the processing logic is configured to (1) calculate raw RMS values of voltage and current from the samples, (2) scale the raw RMS values according to a predetermined calibration factor to obtain calibrated RMS voltage and current values, and (3) compare samples of voltage and current obtained with respect to at least one of the electrical loads during a first cycle of input power with respective samples of voltage and current obtained with respect to the at least one of the electrical loads during a second cycle of input power and generate an alert signal if there is a difference of at least a predetermined magnitude therebetween; and
   wherein the memory stores at least the samples of voltage and current.

2. A power distribution unit as in claim 1 wherein the power distribution unit housing is adapted for mounting within an electrical equipment rack in a vertical orientation.

3. A power distribution unit as in claim 1 and further comprising a numeric display.

4. A power distribution unit as in claim 3 wherein the voltage sensor, the current sensors, the numeric display and the power monitoring section are disposed in the power distribution unit housing.

5. A power distribution unit as in claim 1 wherein the power monitoring section stores the calibrated RMS voltage and current values.

6. A power distribution unit as in claim 1 and further comprising a timing sensor in electrical communication with the power input and the power monitoring section.

7. A power distribution unit as in claim 6 wherein the power monitoring section is responsive to the timing sensor to calculate a frequency of the input power.

8. A power distribution unit as in claim 7 wherein the power monitoring section uses the calculated frequency to compensate for errors in an internal processor time base.

9. A power distribution unit as in claim 6 wherein the power monitoring section is responsive to the timing sensor to calculate a reload value and to use the reload value to determine sampling intervals for sampling the voltage and current.

10. A power distribution unit as in claim 1 and further comprising a communication section for establishing communication between the power monitoring section and a remotely located network power manager.

11. A power distribution unit as in claim 1 wherein the power distribution unit housing is adapted for mounting within an electrical equipment rack in a horizontal orientation.

12. A power distribution unit comprising:
    a power distribution unit housing;
    a power input penetrating the housing;
    a voltage sensor;
    a plurality of power outputs disposed in the housing, each in electrical communication with the power input and each connectable to a respective electrical load;
    a plurality of current sensors, each in electrical communication with one of the power outputs; and
    a power monitoring section having an analog-to-digital converter (ADC) in electrical communication with the voltage sensor and the current sensors, processing logic in electrical communication with the ADC, and a memory in electrical communication with the processing logic;
    wherein the ADC is responsive to signals provided by the sensors to sample the signals and obtain samples of voltage and current during a cycle of input power;
    wherein the processing logic is configured to (1) calculate raw RMS values of voltage and current from the samples, (2) scale the raw RMS values according to a predetermined calibration factor to obtain calibrated RMS voltage and current values, and (3) compare model waveform samples for at least one of the electrical loads with respective samples obtained with respect to the one of the electrical loads during the cycle of input power and generate an alert signal if there is a difference of at least a predetermined magnitude therebetween;
    wherein the memory stores at least the samples of voltage and current.

13. A method of managing a plurality of electrical loads each drawing electrical power from a power distribution unit, the method comprising:
    sampling voltage across and current flowing through each of the electrical loads repeatedly during a cycle of input power;
    calculating raw RMS values of voltage and current from the samples;
    scaling the raw RMS values according to a predetermined calibration factor to obtain calibrated RMS voltage and current values for each of the electrical loads; and
    comparing samples of voltage and current obtained with respect to at least one of the electrical loads during a first cycle of input power with respective samples of voltage and current obtained with respect to the at least one of the electrical loads during a second cycle of input power, and generating an alert signal if there is a difference of at least a predetermined magnitude therebetween.

14. A method as in claim 13 and further comprising storing the samples of voltage and current.

15. A method as in claim 14 wherein storing the samples comprises storing samples of voltage and current obtained over more than one cycle of input power.

16. A method as in claim 13 and further comprising storing the calibrated RMS voltage and current values.

17. A method as in claim 13 and further comprising calculating for each electrical load at least one of average active power, average apparent power, power factor, input current crest factor, phase angle between voltage across and current flowing through the electrical load, and energy consumed over an interval longer than one cycle of input power by the electrical load.

18. A method as in claim 13 and further comprising sensing a zero crossing of a cycle of input power.

19. A method as in claim 18 and further comprising calculating a frequency of the input power.

20. A method as in claim 19 and further comprising compensating an internal time base according to the frequency.

21. A method as in claim 18 and further comprising calculating a reload value; and determining sampling intervals for sampling the voltage and current according to the reload value.

22. A method as in claim 13 and further comprising communicating the calibrated RMS voltage and current values to a remotely located network power manager.

23. A method of managing a plurality of electrical loads each drawing electrical power from a power distribution unit, the method comprising:
   sampling voltage across and current flowing through each of the electrical loads repeatedly during a cycle of input power;
   calculating raw RMS values of voltage and current from the samples;
   scaling the raw RMS values according to a predetermined calibration factor to obtain calibrated RMS voltage and current values for each of the electrical loads; and
   comparing model waveform samples for at least one of the electrical loads with respective samples of voltage and current obtained with respect to the at least one of the electrical loads during the cycle of input power, and generating an alert signal if there is a difference of at least a predetermined magnitude therebetween.

24. A power distribution unit comprising:
   a power distribution unit housing;
   a power input penetrating the housing;
   a voltage sensor;
   a plurality of power outputs disposed in the housing, each in electrical communication with the power input and each connectable to a respective electrical load;
   a plurality of current sensors, each in electrical communication with a respective one of the power outputs; and
   a power monitoring circuit in electrical communication with the voltage sensor and the current sensors and responsive to signals provided by the sensors to generate and compare samples of voltage and current obtained with respect to at least one of the electrical loads during a first cycle of input power with respective samples of voltage and current obtained with respect to the at least one of the electrical loads during a second cycle of input power and generate an alert signal if there is a difference of at least a predetermined magnitude therebetween.

25. A power distribution unit as in claim 24 wherein the power monitoring circuit stores the samples of voltage and current.

26. A power distribution unit as in claim 24 wherein the power monitoring circuit calculates for each electrical load at least one of average active power, average apparent power, power factor, and input current crest factor.

27. A power distribution unit as in claim 24 wherein the power monitoring circuit calculates a phase angle between the voltage across and the current flowing through each electrical load.

28. A power distribution unit as in claim 24 wherein the power monitoring circuit calculates energy consumed by each electrical load over an interval longer than one cycle of input power.

29. A power distribution unit as in claim 24, wherein the power monitoring circuit comprises a processor to compare said samples.

30. A power distribution unit comprising:
   a power distribution unit housing;
   a power input penetrating the housing;
   a voltage sensor;
   a plurality of power outputs disposed in the housing, each in electrical communication with the power input and each connectable to a respective electrical load;
   a plurality of current sensors, each in electrical communication with a respective one of the power outputs; and
   a power monitoring circuit in electrical communication with the voltage sensor and the current sensors and responsive to signals provided by the sensors to generate and compare samples of voltage and current obtained with respect to at least one of the electrical loads during a cycle of input power with respective model waveform samples for the at least one of the electrical loads and generate an alert signal if there is a difference of at least a predetermined magnitude therebetween.

31. A power distribution unit as in claim 30, wherein the power monitoring circuit comprises a processor to compare said samples.

* * * * *